United States Patent
Matsuda et al.

(10) Patent No.: US 9,722,171 B2
(45) Date of Patent: *Aug. 1, 2017

(54) PIEZOELECTRIC MATERIAL, PIEZOELECTRIC ELEMENT, AND ELECTRONIC APPARATUS

(71) Applicant: CANON KABUSHIKI KAISHA, Tokyo (JP)

(72) Inventors: Takanori Matsuda, Chofu (JP); Tatsuo Furuta, Machida (JP); Yasushi Shimizu, Fujisawa (JP); Shinya Koyama, Tokyo (JP); Akira Uebayashi, Tokyo (JP); Hiroshi Saito, Kawasaki (JP); Makoto Kubota, Yokohama (JP); Kenichi Akashi, Kawasaki (JP); Jumpei Hayashi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/385,128

(22) PCT Filed: Mar. 7, 2013

(86) PCT No.: PCT/JP2013/057116
§ 371 (c)(1),
(2) Date: Sep. 12, 2014

(87) PCT Pub. No.: WO2013/137369
PCT Pub. Date: Sep. 19, 2013

(65) Prior Publication Data
US 2015/0053884 A1 Feb. 26, 2015

(30) Foreign Application Priority Data
Mar. 16, 2012 (JP) .................. 2012-060237

(51) Int. Cl.
*C04B 35/462* (2006.01)
*C01G 23/00* (2006.01)
(Continued)

(52) U.S. Cl.
CPC ............ *H01L 41/1871* (2013.01); *B08B 7/02* (2013.01); *B41J 2/14201* (2013.01);
(Continued)

(58) Field of Classification Search
CPC ................ C04B 35/462; C04B 35/468; C04B 35/4682; C04B 35/499; C04B 2235/3206;
(Continued)

(56) References Cited

U.S. PATENT DOCUMENTS 4,755,493 A 7/1988 Takeuchi
4,988,468 A * 1/1991 Nishioka et al. ............. 264/658
(Continued)

FOREIGN PATENT DOCUMENTS

CN 102153344 A 8/2011
EP 0468796 A1 1/1992
(Continued)

OTHER PUBLICATIONS

Lin et al., "Effects of Mn doping on structural and dielectric properties of sol-gel derived (Ba0.835Ca0.165)(Zr0.09Ti0.0.91)O3 thin films", online Apr. 6, 2012, Thin Solid Films, 520, pp. 5146-5150.*
(Continued)

*Primary Examiner* — Matthew E Hoban
*Assistant Examiner* — Lynne Edmondson
(74) *Attorney, Agent, or Firm* — Canon U.S.A., Inc. IP Division

(57) ABSTRACT

The present invention provides a lead-free piezoelectric material having a high piezoelectric constant and a high mechanical quality factor in a wide operating temperature
(Continued)

range. The piezoelectric material includes a perovskite-type metal oxide represented by Formula (1):

$(Ba_{1-x}Ca_x)_a(Ti_{1-y}Zr_y)O_3$ ($1.00 \leq a \leq 1.01$, $0.125 \leq x < 0.155$, and $0.041 \leq y \leq 0.074$)

as a main component. The metal oxide contains Mn in a content of 0.12 parts by weight or more and 0.40 parts by weight or less based on 100 parts by weight of the metal oxide on a metal basis.

27 Claims, 15 Drawing Sheets

(51) Int. Cl.
| H01L 41/187 | (2006.01) |
|---|---|
| C04B 35/468 | (2006.01) |
| H01L 41/083 | (2006.01) |
| H01L 41/09 | (2006.01) |
| B41J 2/14 | (2006.01) |
| H02N 2/10 | (2006.01) |
| H02N 2/16 | (2006.01) |
| C04B 35/626 | (2006.01) |
| B08B 7/02 | (2006.01) |

(52) U.S. Cl.
CPC ....... *B41J 2/14233* (2013.01); *C04B 35/4682* (2013.01); *C04B 35/6261* (2013.01); *C04B 35/62695* (2013.01); *H01L 41/083* (2013.01); *H01L 41/0973* (2013.01); *H02N 2/103* (2013.01); *H02N 2/106* (2013.01); *H02N 2/163* (2013.01); *C04B 2235/3208* (2013.01); *C04B 2235/3225* (2013.01); *C04B 2235/3236* (2013.01); *C04B 2235/3244* (2013.01); *C04B 2235/3248* (2013.01); *C04B 2235/3262* (2013.01); *C04B 2235/3281* (2013.01); *C04B 2235/3418* (2013.01); *C04B 2235/449* (2013.01); *C04B 2235/5445* (2013.01); *C04B 2235/6567* (2013.01); *C04B 2235/77* (2013.01); *C04B 2235/785* (2013.01); *C04B 2235/786* (2013.01); *C04B 2235/79* (2013.01)

(58) Field of Classification Search
CPC .... C04B 2235/3262; C04B 2235/3236; C04B 2235/768; C04B 2235/785; C04B 2235/786; C04B 2235/3248; C04B 2235/781; C01G 23/006; C01G 23/003; C01G 25/006; C01P 2002/34

USPC ............... 252/62.9 PZ, 62.9 R; 501/134–138
See application file for complete search history.

(56) References Cited

U.S. PATENT DOCUMENTS

| 8,866,952 | B2* | 10/2014 | Shimizu et al. | 348/340 |
|---|---|---|---|---|
| 9,052,499 | B2* | 6/2015 | Ohashi et al. | |
| 9,190,602 | B2* | 11/2015 | Kubota | H01L 41/083 |
| 9,419,204 | B2* | 8/2016 | Hayashi | C04B 35/4682 |
| 9,425,380 | B2* | 8/2016 | Hayashi | H01L 41/083 |
| 9,515,249 | B2* | 12/2016 | Hayashi | C04B 35/4682 |
| 9,525,123 | B2* | 12/2016 | Uebayashi | B32B 18/00 |
| 2003/0147194 | A1* | 8/2003 | Hibi et al. | 361/118 |

FOREIGN PATENT DOCUMENTS

| EP | 2328193 A2 | 6/2011 | | |
|---|---|---|---|---|
| JP | 2004187384 A | 7/2004 | | |
| JP | 2009-215111 A | 9/2009 | | |
| JP | 2010-120835 A | 6/2010 | | |
| JP | WO 2013005701 A1 * | 1/2013 | .......... B41J 2/14233 |
| JP | WO 2013005702 A1 * | 1/2013 | ......... C04B 35/4682 |
| KR | 20090005831 A | 1/2009 | | |
| WO | 2013/005700 A1 | 1/2013 | | |
| WO | 2013/005701 A1 | 1/2013 | | |
| WO | 2013/005702 A1 | 1/2013 | | |

OTHER PUBLICATIONS

Jain et al., "Effect of A/B ratio of the microstructures and electrical properties of (Ba0.95±xCa0.05)(Ti0.82Zr0.18)O3 for multilayer ceramic capacitors with nickel electrodes", online Mar. 7, 2008, Journal of Alloys and Compounds, 468, pp. 370-374.*

Wang et al., "Enhanced piezoelectric properties of (Ba0.85Ca0.15)(Ti0.9Zr0.1)O3 lead-free ceramics by optimizing calcination and sintering temperature", online May 14, 2011, Journal of the European Ceramic Society, 31, pp. 2005-2012.*

Xue, et al., "Elastic, piezoelectric, and dielectric properties of Ba(Zr0.2Ti0.8)O3—50(Ba0.7Ca0.3)TiO3 Pb-free ceramic at the morphotropic phase boundary", Journal of Applied Physics, 2011, vol. 109, pp. 054110-1 to 054110-6.

Tanaka, et al., "High Power Characteristics of (Ca,Ba)TiO3 Piezoelectric Ceramics with High Mechanical Quality Factor", Japanese Journal of Applied Physics, 2010, vol. 49, pp. 09MD03-1 to 09MD03-4.

* cited by examiner

PIEZOELECTRIC MATERIAL, PIEZOELECTRIC ELEMENT, AND ELECTRONIC APPARATUS

TECHNICAL FIELD

The present invention relates to a piezoelectric material, in particular, a lead-free piezoelectric material. The present invention also relates to a piezoelectric element and multi-layered piezoelectric element including the piezoelectric material, a method of producing the multilayered piezoelectric element, a liquid discharge head, a liquid discharge device, an ultrasonic motor, an optical apparatus, a vibratory device, a dust removing device, an image pickup device, and an electronic apparatus.

BACKGROUND ART

In general, piezoelectric materials are $ABO_3$ perovskite-type metal oxides such as lead zirconate titanate (hereinafter referred to as "PZT"). However, since PZT contains lead as an A site element, its influence on environment is controversial. Accordingly, there is a demand for a piezoelectric element of a lead-free perovskite-type metal oxide.

Barium titanate is known as a piezoelectric material of a lead-free perovskite-type metal oxide. In addition, in order to improve the characteristics of a piezoelectric material, a material of which base composition is barium titanate has been developed. PTL 1 and NPL 1 disclose materials having improved piezoelectric properties by replacing a part of the A site of barium titanate with Ca and a part of the B site with Zr. These materials, however, have low Curie temperatures, such as 80° C. or less, and thereby cause depolarization under a high-temperature environment, e.g., in a car in summer, to reduce the piezoelectric properties. In addition, since their mechanical quality factors are low, depolarization tends to occur when an AC voltage is applied to.

PTL 2 and NPL 2 disclose materials in which a part of the A site of barium titanate is replaced with Ca and to which Mn, Fe, or Cu is added. Though these materials have excellent mechanical quality factors compared to barium titanate, unfortunately, their piezoelectric properties are low.

CITATION LIST

Patent Literature

PTL 1 Japanese Patent Laid-Open No. 2009-215111
PTL 2 Japanese Patent Laid-Open No. 2010-120835

Non Patent Literature

NPL 1 Journal of Applied Physics, 2011, vol. 109, 054110-1 to 054110-6
NPL 2 Japanese Journal of Applied Physics, 2010, vol. 49, 09MD03-1 to 09MD03-4

SUMMARY OF INVENTION

Technical Problem

The present invention provides a lead-free piezoelectric material having a high piezoelectric constant and a high mechanical quality factor in a wide operating temperature range.

Solution to Problem

The piezoelectric material according to the present invention includes a perovskite-type metal oxide represented by Formula (1):

$$(Ba_{1-x}Ca_x)_a(Ti_{1-y}Zr_y)O_3 \ (1.00 \leq a \leq 1.01,$$
$$0.125 \leq x < 0.155, \text{ and } 0.041 \leq y \leq 0.074),$$

as a main component, wherein the metal oxide contains Mn in a content of 0.12 parts by weight or more and 0.40 parts by weight or less based on 100 parts by weight of the metal oxide on a metal basis.

Advantageous Effects of Invention

The present invention can provide a lead-free piezoelectric material having a high piezoelectric constant and a high mechanical quality factor in a wide operating temperature range.

Further features of the present invention will become apparent from the following description of exemplary embodiments with reference to the attached drawings.

DESCRIPTION OF EMBODIMENTS

Figure 1:
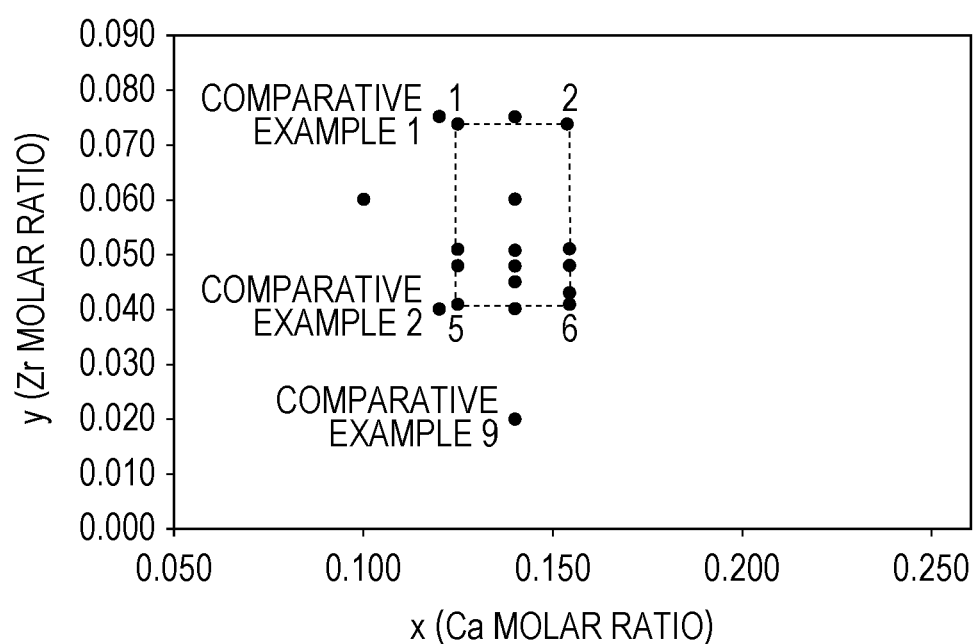
FIG. 1 is a graph showing a relationship between the x-values and the y-values of piezoelectric materials in Examples 1 to 22 of the present invention and in Comparative Examples 1 to 9, where the area surrounded by the dotted line is a range of the x-values and the y-values of the present invention.

Embodiments of the present invention will now be described.

The piezoelectric material according to the present invention includes a perovskite-type metal oxide represented by Formula (1):

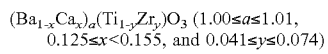
(1.00≤a≤1.01, 0.125≤x<0.155, and 0.041≤y≤0.074)

as a main component, wherein the metal oxide contains Mn in a content of 0.12 parts by weight or more and 0.40 parts by weight or less based on 100 parts by weight of the metal oxide on a metal basis.

In the above description, the "perovskite-type metal oxide represented by Formula (1) is contained as a main component" means that the main component for expressing the piezoelectric properties is the perovskite-type metal oxide represented by Formula (1). For example, the piezoelectric material may contain a component for adjusting properties thereof, such as manganese mentioned above, or impurities introduced during the manufacturing.

The perovskite-type metal oxide in the present invention refers to a metal oxide having a perovskite structure, which is ideally a tetragonal structure, as described in Iwanami Dictionary of Physics and Chemistry, 5th Edition (Iwanami Shoten, Published on Feb. 20, 1998). The metal oxide having a perovskite structure is generally expressed by a chemical formula: $ABO_3$. In the perovskite-type metal oxide, elements A and B occupy specific unit cell positions called A site and B site, respectively, in the ion forms. For example, in a cubic unit cell, the element A is placed at the vertexes of the cubic, and the element B is placed at the body-centered position of the cubic. The element O occupies the face-centered positions as anions of oxygen.

In the metal oxide represented by Formula (1), the metal elements positioned at the A site are Ba and Ca, and the metal elements positioned at the B site are Ti and Zr. However, a part of the Ba and Ca atoms may be positioned at the B site. Similarly, a part of the Ti and Zr atoms may be positioned at the A site.

The molar ratio of the elements at the B site to the element O in Formula (1) is basically 1:3, but the molar ratio may be shift slightly (e.g., in a range of 1.00:2.94 to 1.00:3.06) as long as the perovskite structure is the primary phase of the metal oxide. Such a case is included in the scope of the present invention.

The "perovskite structure is the primary phase" means that the peak showing the maximum diffraction intensity in the X-ray diffraction of a piezoelectric material powder is originated in the perovskite structure. Furthermore, the primary phase can be a "single phase" in which the crystals having a perovskite structure substantially occupy the entire phase.

The perovskite structure of the metal oxide can be confirmed by structural analysis, such as X-ray diffraction or electron beam diffraction.

The piezoelectric material according to the present invention may be in any form, such as a ceramic, powder, single crystal, film, or slurry, and, in particular, can be a ceramic. Throughout the specification, the term "ceramic" refers to aggregate (also referred to as bulk body) of crystal grains, of which base component is a metal oxide, fired by heat treatment, a so-called polycrystal, and includes those processed after sintering.

In Formula (1), "a" represents the ratio of the molar quantity of Ba and Ca at the A site to the molar quantity of Ti and Zr at the B site and is in the range of 1.00≤a≤1.01. If the value of a is smaller than 1.00, grains tend to abnormally grow to reduce the mechanical strength of the material. In contrast, if the value of a is larger than 1.01, the temperature necessary for grain growth is too high, which makes sintering in a common sintering furnace impossible. Herein, "being impossible to be sintered" indicates that a sufficient density is not obtained or that a large number of pores or defects are formed in the piezoelectric ceramic.

In Formula (1), "x" represents the molar ratio of Ca at the A site and is in the range of 0.125≤x<0.155. If the value of x is smaller than 0.125, the phase transition of the crystal structure occurs in an operating temperature of, for example, −10° C. to 50° C. to adversely affect the durability. In contrast, if the value of x is 0.155 or more, the piezoelectric properties are insufficient. From the viewpoint of providing better piezoelectric properties, the value of x can be in the range of 0.125≤x≤0.145.

In Formula (1), "y" represents the molar ratio of Zr at the B site and is in the range of 0.041≤y≤0.074. If the value of y is smaller than 0.041, the piezoelectric properties are insufficient. In contrast, if the value of y is larger than 0.074, the Curie temperature ($T_C$) is low, less than 100° C., to lose the piezoelectric properties at high temperature. From the viewpoint of providing better piezoelectric properties, the value of y can be in the range of 0.051≤y≤0.074.

Throughout the specification, the term "Curie temperature" indicates the temperature at which the ferroelectricity of a material is lost. In general, the piezoelectric properties of a piezoelectric material are also lost at a temperature of not lower than the Curie temperature. The Curie temperature can be directly measured by changing the measurement temperature to determine the temperature at which the ferroelectricity is lost or can be determined from the temperature showing the maximum relative dielectric constant determined using a small AC electric field with changing the measurement temperature.

The composition of the piezoelectric material in a piezoelectric element according to the present invention may be measured by any method, such as X-ray fluorescence analysis, ICP emission spectrochemical analysis, or atomic absorption spectrometry. Every method can calculate the weight ratio and the composition ratio of each element contained in the piezoelectric material.

The content of Mn contained in the piezoelectric material of the present invention is 0.12 parts by weight or more and 0.40 parts by weight or less based on 100 parts by weight of the metal oxide on a metal basis. The piezoelectric material of the present invention contains Mn in the above-mentioned range and thereby has improved insulation properties and mechanical quality factor. Herein, the mechanical quality factor is a factor representing the elastic loss resulting from vibration when a piezoelectric material is evaluated as an oscillator, and the value of the mechanical quality factor is observed as the sharpness of a resonance curve in impedance measurement. That is, the mechanical quality factor represents the sharpness of resonance of an oscillator. Improvements in insulation properties and mechanical quality factor ensure long-term reliability when the piezoelectric material is driven as a piezoelectric element with application of a voltage.

Herein, the term "on a metal basis" showing the value determined by measuring the contents of metals, Ba, Ca, Ti, Zr, and Mn, of the piezoelectric material by, for example, X-ray fluorescence analysis (XRF), ICP emission spectrochemical analysis, or atomic absorption spectrometry, converting the contents of the elements constituting the metal oxide represented by Formula (1) to those of oxides, and calculating the ratio of the Mn weight to the total weight when the total weight is assumed to be 100. If the content of Mn is less than 0.12 parts by weight, the mechanical quality factor at 25° C. is low, less than 300. A low mechanical quality factor increases the electricity consumption for driving a resonance device using a piezoelectric element of the piezoelectric material formed by attaching a pair of electrodes to the piezoelectric material. The mechanical quality factor at 25° C. can be 700 or more, such as 800 or more. In this range, no significant increase in electricity consumption occurs in practical driving. In contrast, if the content of Mn is higher than 0.40 parts by weight, the piezoelectric properties are insufficient, and hexagonal crystals, which do not contribute to piezoelectric properties, may appear.

Mn can be present only at the B site. In the case where Mn is dissolved in the B site, the ratio (A/B) of the total molar amount (A) of Ba and Ca at the A site to the total molar amount (B) of Ti, Zr, and Mn at the B site is in the range of $0.992 \leq A/B \leq 0.999$. When the ratio A/B is in this range, the piezoelectric material can have particularly excellent piezoelectric constant and mechanical quality factor. Accordingly, a device having excellent durability can be produced from the piezoelectric material of the present invention.

The valence of Mn can be 4+. In general, the valence of Mn can be 4+, 2+, or 3+. When a crystal contains a conduction electron (e.g., a case of a crystal having an oxygen defect or a case of the A site including a donor element), the conduction electron is trapped by decreasing the valence of Mn from 4+ to 3+ or 2+ to enhance the insulation resistance. In addition, from the viewpoint of ionic radius, Mn having a valence of 4+ can easily replace Ti, which is the main component of the B site.

In contrast, when the valence of Mn is lower than 4+, such as 2+, Mn serves as an acceptor. If Mn is present in a perovskite structure crystal as an acceptor, a hole is generated in the crystal, or oxygen vacancy is formed in the crystal.

If the majority of Mn atoms contained in the piezoelectric material have a valence of 2+ or 3+, the holes are not completely compensated by the introduction of oxygen vacancy only, resulting in a reduction of the insulation resistance. Accordingly, the majority of Mn atoms have a valence of 4+. However, a significantly small amount of Mn atoms having a valence of lower than 4+ may be present as an acceptor at the B site of the perovskite structure to form oxygen vacancy. It is obvious that the Mn having a valence of 2+ or 3+ and the oxygen vacancy form a defect dipole to enhance the mechanical quality factor of the piezoelectric material.

The piezoelectric material according to the present invention may contain any component (hereinafter, referred to as accessory component), in addition to the components represented by Formula (1) and Mn, in a range that does not change the properties of the material. The total amount of the accessory components can be 1.2 parts by weight or less based on 100 parts by weight of the metal oxide represented by Formula (1). If the content of the accessory components exceeds 1.2 parts by weight, the piezoelectric properties and the insulation properties of the piezoelectric material may decrease. In addition, the content of metal elements, other than Ba, Ca, Ti, Zr, and Mn, as the accessory components can be 1.0 part by weight or less on an oxide basis or 0.9 parts by weight or less on a metal basis with respect to the piezoelectric material. Throughout the specification, the term "metal element" includes semimetal elements such as Si, Ge, and Sb. If the content of the metal elements, other than Ba, Ca, Ti, Zr, and Mn, as the accessory components exceeds 1.0 part by weight on an oxide basis or 0.9 parts by weight on a metal basis with respect to the piezoelectric material, the piezoelectric properties and the insulation properties of the piezoelectric material may decrease. The total content of Li, Na, and Al elements as the accessory components can be 0.5 parts by weight or less on a metal basis with respect to the piezoelectric material. A total content of Li, Na, and Al elements as the accessory components exceeding 0.5 parts by weight on a metal basis with respect to the piezoelectric material may make the sintering insufficient. If the piezoelectric material contains Y element as an accessory component, the content of the Y element can be 0.5 parts by weight or less on a metal basis with respect to the piezoelectric material. A content of the Y element exceeding 0.5 parts by weight on a metal basis with respect to the piezoelectric material may make the polarization treatment difficult.

Examples of the accessory component include sintering aids such as Si and Cu. In addition, the piezoelectric material of the present invention may contain Sr in an amount comparable to that contained in commercially available raw materials of Ba and Ca as an inevitable component. Similarly, the piezoelectric material of the present invention may contain Nb in an amount comparable to that contained in a commercially available Ti raw material as an inevitable component and Hf in an amount comparable to that contained in a commercially available Zr raw material as an inevitable component.

The content (part(s) by weight) of the accessory component may be measured by any method, and examples of the method include X-RAY fluorescence analysis, ICP emission spectrochemical analysis, and atomic absorption spectrometry.

The piezoelectric material according to the present invention has a Curie temperature of 100° C. or more and thereby can maintain the piezoelectric performance without losing it even under the strict conditions of a temperature of 80° C., which is a supposed temperature in a car in summer, and can have stable piezoelectric constant and mechanical quality factor.

In the piezoelectric material according to the present invention, the crystal grains constituting the piezoelectric material can have an average equivalent circular diameter of 1 μm or more and 10 μm or less. When the average equivalent circular diameter is in this range, the piezoelectric material of the present invention can have satisfactory piezoelectric properties and mechanical strength. An average equivalent circular diameter of less than 1 μm may make the piezoelectric properties insufficient. In contrast, an average equivalent circular diameter of larger than 10 μm may decrease the mechanical strength. The average equivalent circular diameter can be in a range of 2 μm or more and 8 μm or less.

Throughout the specification, the term "equivalent circular diameter" represents "projected area equivalent circular diameter" usually used in microscopic observation and represents the diameter of a perfect circle having the same area as that of the projected area of a crystal grain. In the present invention, the equivalent circular diameter may be measured by any method. For example, the equivalent circular diameter can be determined by image processing of an image of the piezoelectric material surface photographed with a polarizing microscope or a scanning electron microscope. Since the optimum magnification depends on the grain diameter of an object, an optical microscope or an electron microscope may be used depending on the diameter. The equivalent circular diameter may be determined from an image of a polished surface or a cross section instead of the surface of a material.

The piezoelectric material of the present invention can have a relative density of 97.0% or more and 100% or less.

A relative density of less than 97.0% may provide insufficient piezoelectric properties and mechanical quality factor or may reduce the mechanical strength.

The term "relative density" indicates the ratio of the measured density to the theoretical density calculated from the lattice constant of the piezoelectric material and the atomic weight of the constituent elements of the piezoelectric material. Herein, the lattice constant can be measured by, for example, X-ray diffraction analysis. The density can be measured by, for example, an Archimedes's method.

The piezoelectric material according to the present invention may be produced by any method.

The piezoelectric material can be produced by a common process of sintering a solid powder of, for example, oxides, carbonates, nitrates, or oxalates containing constituent elements under an ordinary pressure. The raw material is constituted of metal compounds such as a Ba compound, a Ca compound, a Ti compound, a Zr compound, and a Mn compound.

Usable examples of the Ba compound include barium oxide, barium carbonate, barium oxalate, barium acetate, barium nitrate, barium titanate, barium zirconate, and barium zirconate titanate.

Usable examples of the Ca compound include calcium oxide, calcium carbonate, calcium oxalate, calcium acetate, calcium titanate, and calcium zirconate.

Usable examples of the Ti compound include titanium oxide, barium titanate, barium zirconate titanate, and calcium titanate.

Usable examples of the Zr compound include zirconium oxide, barium zirconate, barium zirconate titanate, and calcium zirconate.

Usable examples of the Mn compound include manganese carbonate, manganese oxide, manganese dioxide, manganomanganic oxide, and manganese acetate.

In the piezoelectric material of the present invention, the ratio "a" of the molar quantity of Ba and Ca at the A site to the molar quantity of Ti and Zr at the B site may be adjusted by any raw material. Any of the Ba compounds, the Ca compounds, the Ti compounds, and the Zr compounds shows the same effect.

The raw material powder of the piezoelectric material according to the present invention may be granulated by any method. From the viewpoint of giving a granulated powder having a uniform particle diameter, spray-dry can be employed.

Usable examples of the binder that is used in granulation include polyvinyl alcohol (PVA), polyvinyl butylal (PVB), and acrylic resins. The binder is used in an amount of 1 part by weight to 10 parts by weight, in particular, 2 parts by weight to 5 parts by weight from the viewpoint of giving a compact having a higher density.

The piezoelectric material according to the present invention may be sintered by any method.

Examples of the sintering include sintering in an electric furnace, sintering in a gas furnace, electrical heating, microwave sintering, millimeter-wave sintering, and hot isostatic pressing (HIP). The electric furnace and the gas furnace may be continuous furnaces or batch furnaces.

The sintering of the piezoelectric material may be performed at any temperature and can be performed at a temperature allowing each compound to react and crystals to sufficiently grow. From the viewpoint of giving grains of the piezoelectric material having a grain diameter in the range of 1 to 10 μm, the sintering temperature can be 1200° C. or more and 1550° C. or less, such as 1300° C. or more and 1480° C. or less. The piezoelectric material sintered in such a temperature range shows satisfactory piezoelectric performance.

In order to stably reproduce the properties of a piezoelectric material prepared by sintering, the sintering is performed at a constant temperature within the above-mentioned range for 2 to 24 hours. Though sintering such as two-stage sintering may be employed, a rapid decrease in temperature should be avoided in light of productivity.

The piezoelectric material after polishing processing may be heat-treated at a temperature of 1000° C. or more. Mechanical polishing generates a residual stress inside the piezoelectric material. The heat treatment at 1000° C. or more relieves the residual stress to further enhance the piezoelectric properties of the piezoelectric material. The heat treatment also has an effect of eliminating the raw material powder, such as barium carbonate, precipitated at the grain boundaries. The heat treatment may be performed for any period of time, such as 1 hour or more.

Figure 2:
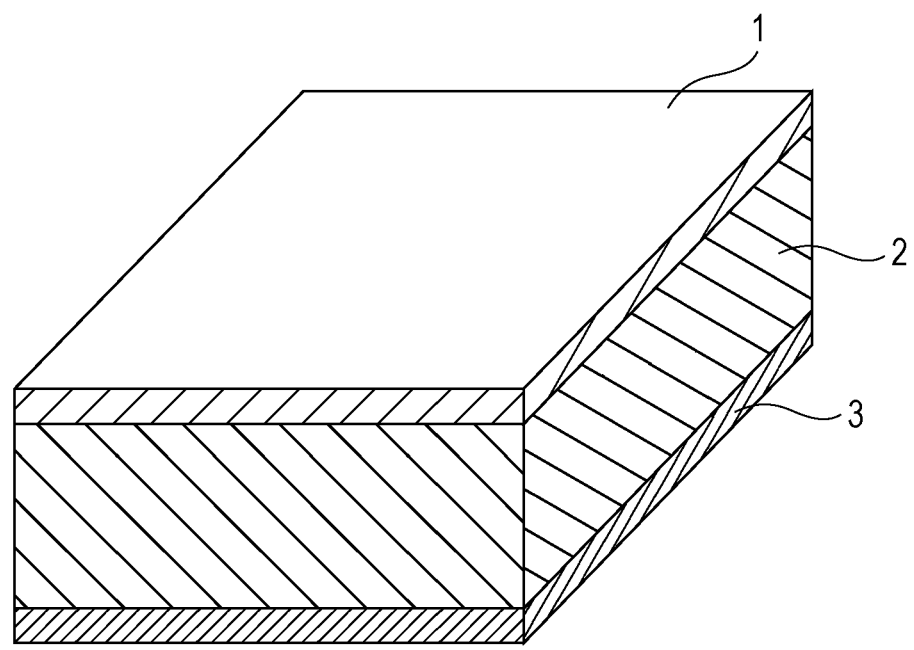
FIG. 2 is a schematic diagram illustrating an embodiment of the configuration of a piezoelectric element.

FIG. 2 is a schematic diagram illustrating an embodiment of the configuration of a piezoelectric element. The piezoelectric properties of the piezoelectric material 2 according to the present invention can be evaluated by being produced into a piezoelectric element having at least a first electrode 1 and a second electrode 3. The first and the second electrodes are each a conductive layer having a thickness of about 5 to 2000 nm. The electrodes may be made of any material that is usually used in piezoelectric elements. Examples of the material include metals such as Ti, Pt, Ta, Ir, Sr, In, Sn, Au, Al, Fe, Cr, Ni, Pd, Ag, and Cu; and compounds thereof.

The first and the second electrodes may be each made of any of these materials or may be each a multilayer made of two or more of these materials. The first and the second electrodes may be made of different materials.

The first and the second electrodes may be produced by any method and may be formed by, for example, baking of a metal paste, sputtering, or vapor deposition. The first and the second electrodes may be each patterned into a desired shape.

In the piezoelectric element, the spontaneous polarization axes may be unidirectionally aligned. The unidirectionally aligned spontaneous polarization axes increase the piezoelectric constant of the piezoelectric element. The piezoelectric element may be polarized by any method. The polarization treatment may be performed in the atmosphere or in a silicone oil. The polarization may be performed at a temperature of 60° C. to 100° C. The optimum conditions for the polarization slightly depend on the composition of the piezoelectric material constituting the element. The electric field applied in the polarization treatment may be from 800 V/mm to 2.0 kV/mm.

The piezoelectric constant and the mechanical quality factor of the piezoelectric element can be determined by calculation based on Electronic Materials Manufacturers Association Standard (JEITA EM-4501) from the resonance frequency and the antiresonance frequency measured with a commercially available impedance analyzer. This method is hereinafter referred to as a resonance-antiresonance method.

An example of production of a multilayered piezoelectric element will now be described.

Figure 3A:
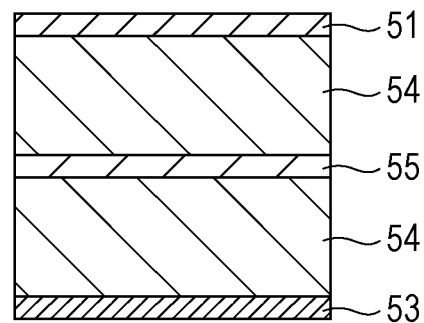
FIGS. 3A and 3B are schematic cross-sectional diagrams illustrating an embodiment of the configuration of a multilayered piezoelectric element.
Figure 3B:
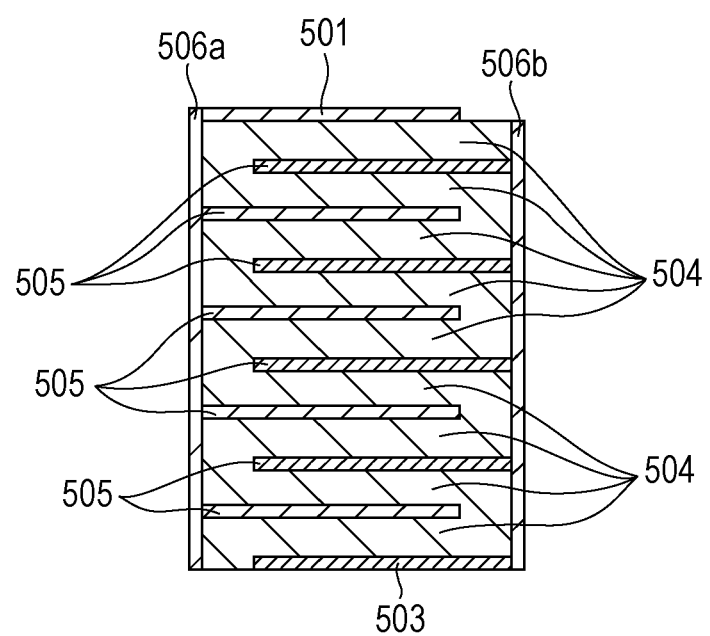

FIGS. 3A and 3B are schematic cross-sectional diagrams illustrating an embodiment of the configuration of a multilayered piezoelectric element. The multilayered piezoelectric element is constituted of piezoelectric material layers 54 and electrode layers including an internal electrode 55, and these layers are alternately stacked. The piezoelectric material layers 54 are made of the above-described piezoelectric material. The electrode layers may include a first electrode 51 and a second electrode 53, in addition to the internal electrode 55.

FIG. 3A shows a configuration of a multilayered piezoelectric element where two piezoelectric material layers 54 and one internal electrode 55 are alternately stacked and the layered structure is disposed between the first electrode 51 and the second electrode 53. As shown in FIG. 3B, the numbers of the piezoelectric material layer and the internal electrode may be increased, and the numbers are not limited. In the multilayered piezoelectric element shown in FIG. 3B, nine piezoelectric material layers 504 and eight internal electrodes 505 are alternately stacked, and the layered structure is disposed between the first electrode 501 and the second electrode 503. The multilayered piezoelectric element includes an external electrode 506a and an external electrode 506b for short-circuiting the alternately disposed internal electrodes.

The internal electrodes 55 and 505 and the external electrodes 506a and 506b may have sizes and shapes different from those of the piezoelectric material layers 504 and may be divided into two or more pieces.

The internal electrodes 55 and 505 and the external electrodes 506a and 506b are each a conductive layer having a thickness of about 5 to 2000 nm and may be made of any material that is usually used in piezoelectric elements. Examples of the material include metals such as Ti, Pt, Ta, Ir, Sr, In, Sn, Au, Al, Fe, Cr, Ni, Pd, Ag, and Cu; and compounds thereof. The internal electrodes 55 and 505 and the external electrodes 506a and 506b may be each made of any one of these materials or a mixture or alloy of two or more of these materials or may be each a multilayer made of two or more of these materials. Two or more of these electrodes may be made of different materials.

The internal electrodes 55 and 505 each contain Ag and Pd, the weight ratio M1/M2 of the content M1 of the Ag to the content M2 of the Pd can be $0.25 \leq M1/M2 \leq 4.0$, such as $0.3 \leq M1/M2 \leq 3.0$. A weight ratio M1/M2 of less than 0.25 disadvantageously raises the sintering temperature of the internal electrode. In contrast, a weight ratio M1/M2 of higher than 4.0 forms an island-like internal electrode to make the surface uneven.

From the viewpoint of inexpensive electrode materials, the internal electrodes 55 and 505 can contain at least one of Ni and Cu. The multilayered piezoelectric element having the internal electrode 55 or 505 containing at least one of Ni and Cu can be sintered in a reducing atmosphere as an example of production.

As shown in FIG. 3B, a plurality of electrodes including the internal electrode 505 may be short-circuited to each other for adjusting the phase of the driving voltage. For example, the internal electrodes 505, the first electrode 501, and the second electrode 503 are alternately short-circuited. The form of short-circuit between electrodes is not particularly limited. An electrode or wiring for short circuit may be disposed on the side surface of the multilayered piezoelectric element. Alternatively, electrodes may be short-circuited with a conductive material disposed inside a through-hole formed so as to pass through the piezoelectric material layers 504.

An example of production of a liquid discharge head including the piezoelectric material of the present invention will now be described.

Figure 4A:
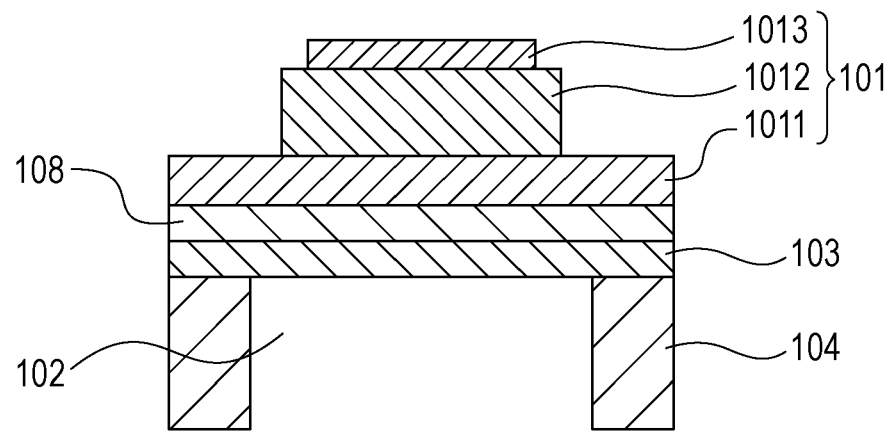
FIGS. 4A and 4B are schematic diagrams illustrating an embodiment of the configuration of a liquid discharge head.
Figure 4B:
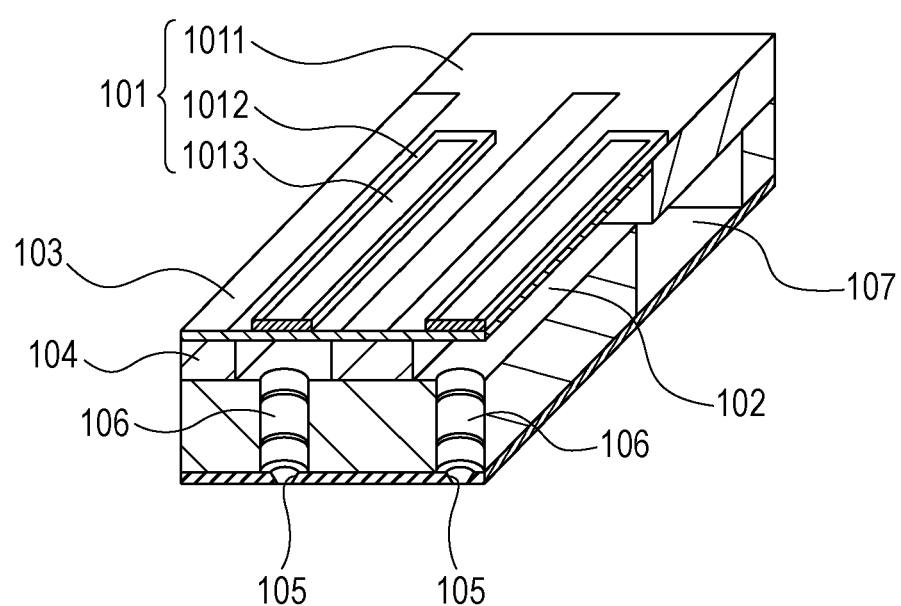

FIGS. 4A and 4B are schematic diagrams illustrating an embodiment of the configuration of a liquid discharge head.

As shown in FIGS. 4A and 4B, the liquid discharge head as an example of production has a piezoelectric element 101 including the piezoelectric material of the present invention. The piezoelectric element 101 includes at least a first electrode 1011, a piezoelectric material 1012, and a second electrode 1013. The piezoelectric material 1012 is optionally patterned as shown in FIG. 4B.

FIG. 4B is a schematic diagram of a liquid discharge head. The liquid discharge head includes discharge ports 105, individual liquid chambers 102, communication holes 106 connecting the individual liquid chambers 102 to the corresponding discharge ports 105, liquid chamber partitions 104, a common liquid chamber 107, diaphragms 103, and piezoelectric elements 101. The piezoelectric element 101 shown in the figure has a rectangular shape, but the shape may be, for example, elliptical, circular, or parallelogram. In general, the piezoelectric material 1012 has a shape along the shape of the individual liquid chamber 102.

The vicinity of the piezoelectric element 101 including the piezoelectric material of the present invention in the liquid discharge head as an example of production will be described in detail with reference to FIG. 4A. FIG. 4A is a cross-sectional view of the piezoelectric element shown in FIG. 4B in the width direction of the liquid discharge head. The cross section of the piezoelectric element 101 shown in FIG. 4A is rectangular, but may be trapezoidal or reverse trapezoidal.

In addition, a buffer layer 108 may be disposed between the diaphragm 103 and the lower electrode.

In the liquid discharge head, the diaphragm 103 vibrates up and down by the expansion and contraction of the piezoelectric material 1012 and applies a pressure to the liquid in the individual liquid chamber 102. As a result, the liquid is discharged from the discharge port 105. The liquid discharge head as an example of production can be used in printing or can be applied to an electronic device.

The diaphragm 103 can have a thickness of 1.0 µm or more and 15 µm or less, such as 1.5 µm or more and 8 µm or less. The diaphragm may be made of any material. For example, the diaphragm may be made of Si, and Si of the diaphragm may be doped with B or P. In addition, the buffer layer or the electrode layer on the diaphragm may be a part of the diaphragm.

The buffer layer 108 may have a thickness of 5 nm or more and 300 nm or less, such as 10 nm or more and 200 nm or less.

The discharge port 105 has a size of 5 µm or more and 40 µm or less as the equivalent circular diameter. The shape of the discharge ports 105 may be circular or a star, square, or triangle shape.

An example of production of a liquid discharge device including the piezoelectric material of the present invention will now be described.

Figure 5:
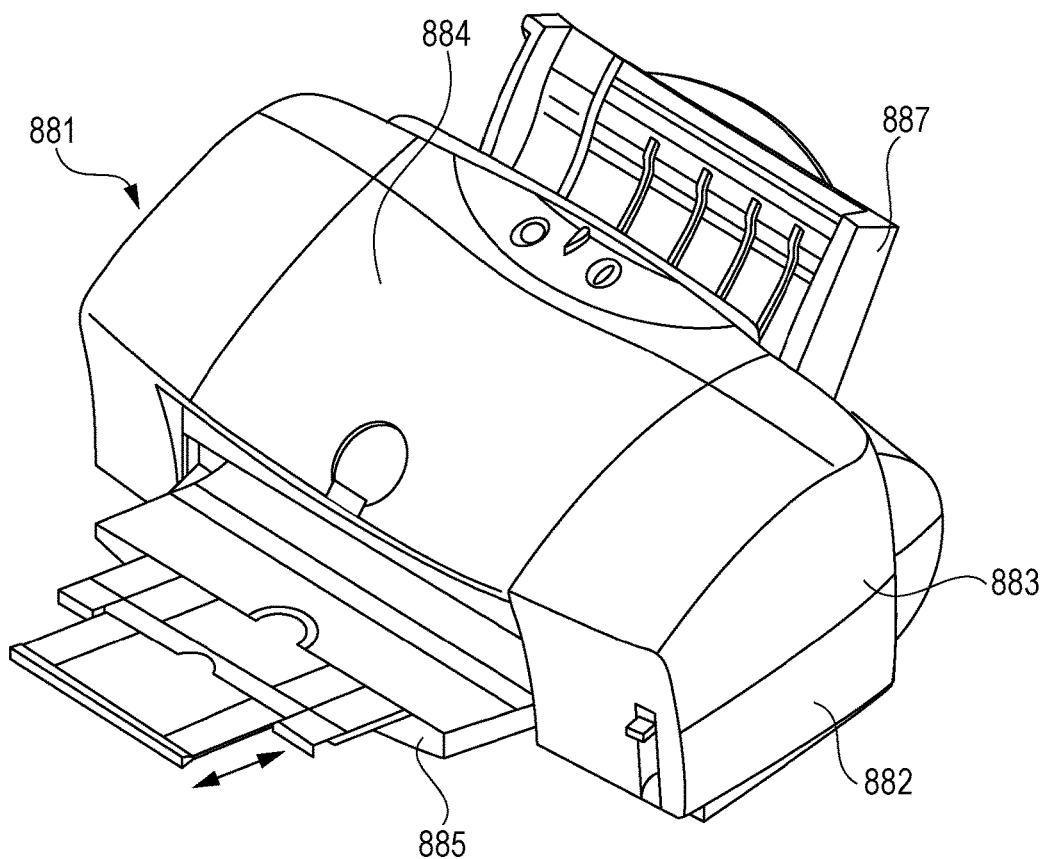
FIG. 5 is a schematic diagram illustrating an embodiment of a liquid discharge device.
Figure 6:
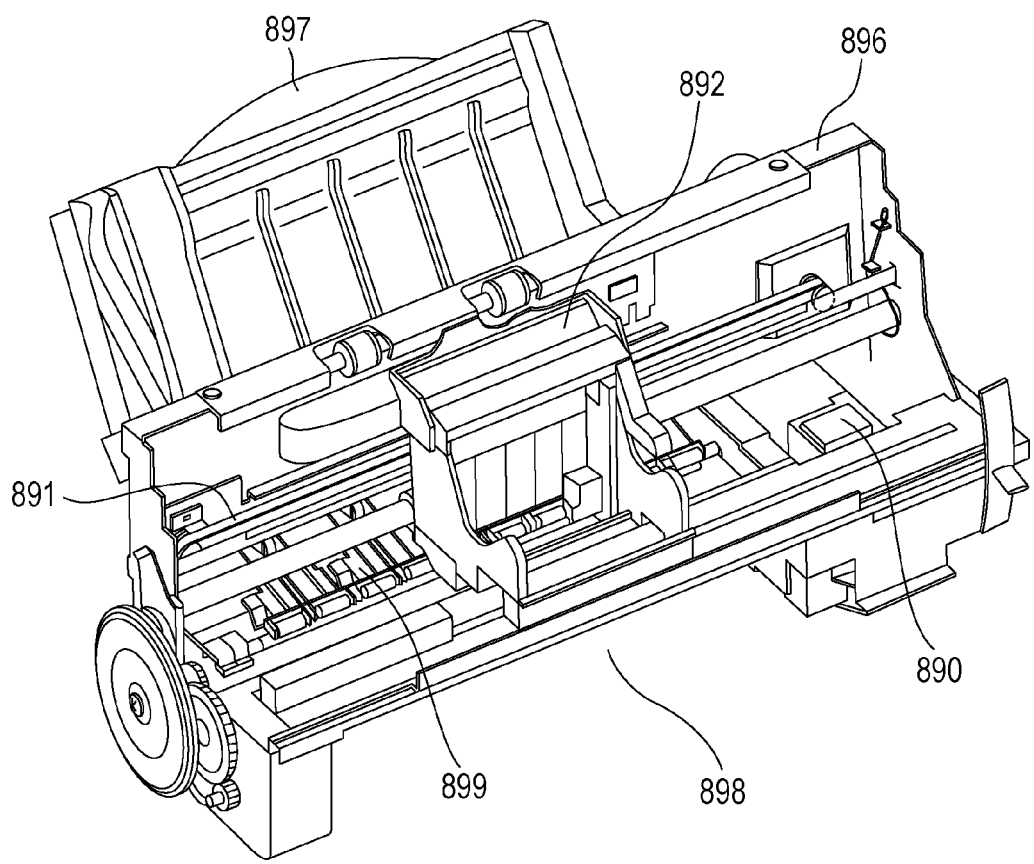
FIG. 6 is a schematic diagram illustrating an embodiment of a liquid discharge device.

As shown in FIGS. 5 and 6, the liquid discharge device as an example of production is an ink-jet recording apparatus. FIG. 6 shows the liquid discharge device (ink-jet recording apparatus) 881 shown in FIG. 5 in a state where the exteriors 882 to 885 and 887 are removed. The ink-jet recording apparatus 881 includes an automatic feeder 897 for automatically feeding recoding paper as a recording medium to the device main body 896. Furthermore, the ink-jet recording apparatus 881 includes a conveying portion 899 for conveying the recording paper fed from the automatic feeder 897 to a predetermined recording position and then conveying the recording paper from the recording position to the ejection port 898; a recording portion 891 for performing recording onto the recording paper conveyed to the recording position; and a recovering portion 890 for performing recovering treatment to the recording portion 891. The recording portion 891 is provided with a carriage 892 that receives the liquid discharge head including the piezoelectric material of the present invention and moves on a rail in a reciprocating motion.

In such an ink-jet recording apparatus, the carriage 892 slides on the rail according to the electric signals sent from a computer, and the piezoelectric material is displaced by application of a driving voltage to the electrodes between which the piezoelectric material is disposed. The displacement of the piezoelectric material applies a pressure to the individual liquid chamber 102 via the diaphragm 103 shown in FIG. 4B and thereby an ink is discharged from the discharge port 105 to perform printing.

In the liquid discharge device including the piezoelectric material of the present invention, it is possible to uniformly discharge a liquid at high speed and to reduce the size of the device.

The above-described example of the liquid discharge device is a printer, but the liquid discharge device can be used as not only an ink-jet recording apparatus, such as a facsimile machine, a multifunction machine, or a copier, but also a liquid discharge device in industrial use.

An example of production of an ultrasonic motor including the piezoelectric material of the present invention will now be described.

Figure 7A:
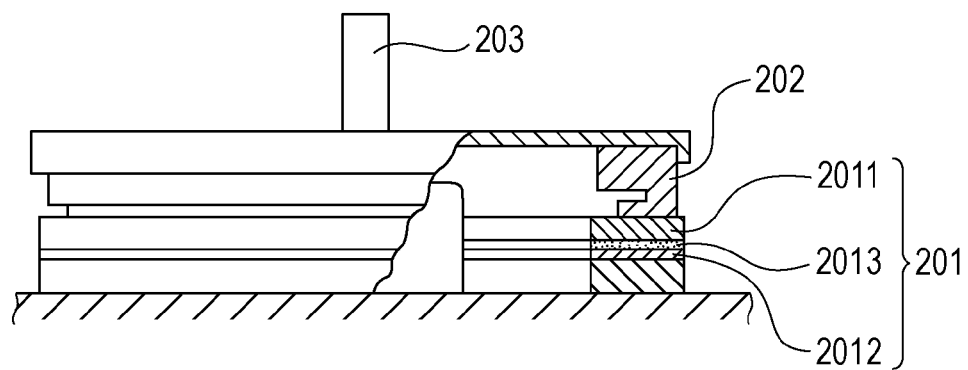
FIGS. 7A and 7B are schematic diagrams illustrating an embodiment of the configuration of an ultrasonic motor.
Figure 7B:
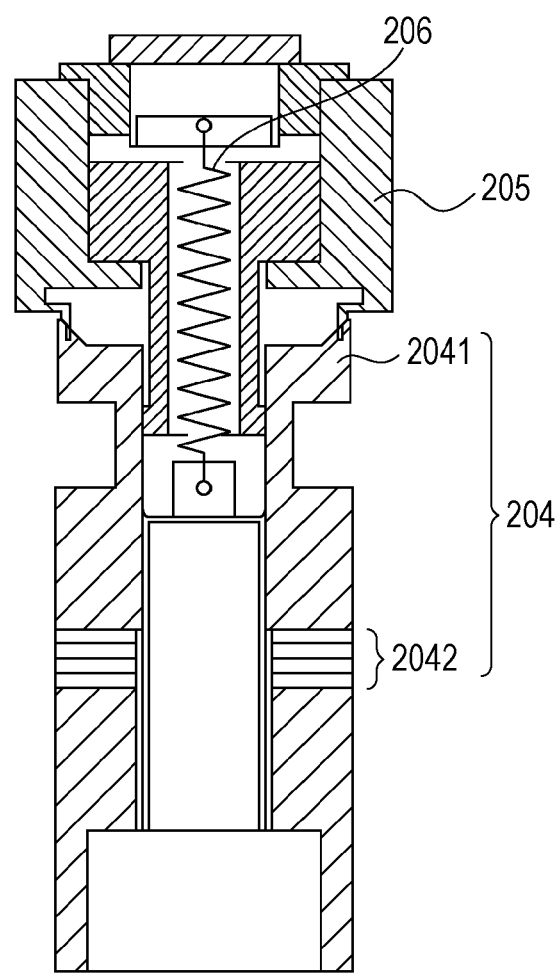

FIGS. 7A and 7B are schematic diagrams illustrating an embodiment of the configuration of an ultrasonic motor. FIG. 7A shows an ultrasonic motor having a piezoelectric element of a single plate. The ultrasonic motor includes an oscillator 201, a rotor 202 which is a rotor being in contact with the sliding surface of the oscillator 201 by means of a pressure applied by a spring (not shown), and an output shaft 203 disposed integrally with the rotor 202. The oscillator 201 is composed of a metal elastic ring 2011, a piezoelectric element 2012 including the piezoelectric material of the present invention, and an organic adhesive (e.g., epoxy or cyanoacrylate adhesive) 2013 for bonding the piezoelectric element 2012 to the elastic ring 2011. The piezoelectric element 2012 including the piezoelectric material of the present invention is constituted of a first electrode, a second electrode (both are not shown), and the piezoelectric material disposed therebetween.

When alternating voltage different in phase by odd number times π/4 is applied to the piezoelectric element including the piezoelectric material of the present invention, flexural traveling waves are generated in the oscillator 201, and each point on the sliding surface of the oscillator 201 moves in an elliptic motion. The rotor 202 is pressed to the sliding surface of the oscillator 201 and is thereby receives a frictional force from the oscillator 201 to rotate in the direction opposite the flexural traveling waves. The object (not shown) to be driven is connected to the output shaft 203 and is driven by the turning force of the rotor 202.

A piezoelectric material applied with voltage expands and contracts by the transverse piezoelectric effect. When an elastic material such as a metal is in contact with the piezoelectric element, the elastic material is bent by the expansion and contraction of the piezoelectric material. The ultrasonic motor described here utilizes this principle.

FIG. 7B shows an example of an ultrasonic motor including a piezoelectric element having a layered structure. The oscillator 204 is composed of a tubular metal elastic bodies 2041 and a multilayered piezoelectric element 2042 disposed between the elastic bodies. The multilayered piezoelectric element 2042 is constituted of a plurality of stacked piezoelectric materials (not shown) and includes first and second electrodes on the outer surfaces of the stacked piezoelectric materials and an internal electrode between the stacked piezoelectric materials. The metal elastic bodies 2041 are connected to each other with a bolt to fix the multilayered piezoelectric element 2042 therebetween to form the oscillator 204.

When alternating voltage different in phase is applied to the multilayered piezoelectric element 2042, the oscillator 204 generates two vibrations rectangular to each other. The two vibrations are combined to create a circular vibration for driving the end portion of the oscillator 204. The oscillator 204 is provided with a circumferential groove at the upper portion to enlarge the vibration for driving.

The rotor 205 is in pressurized contact with the oscillator 204 by means of the pressurizing spring 206 to create a frictional force for driving. The rotor 205 is rotatably supported by bearing.

An example of production of an optical apparatus including the piezoelectric material of the present invention will now be described. The optical apparatus as an example of production includes the ultrasonic motor in the driving unit.

Figure 8A:
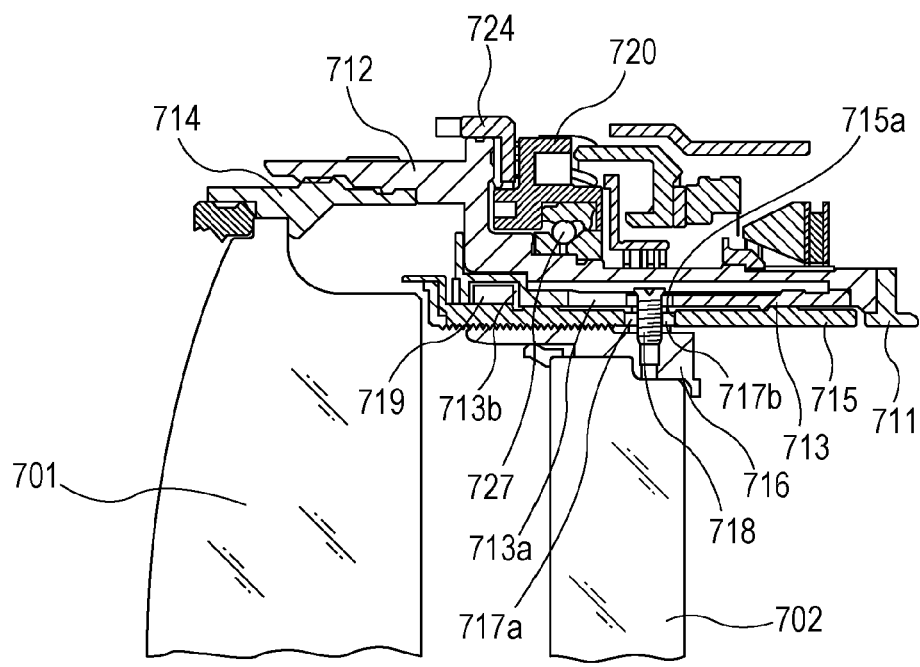
FIGS. 8A and 8B are schematic diagrams illustrating an embodiment of an optical apparatus.
Figure 8B:
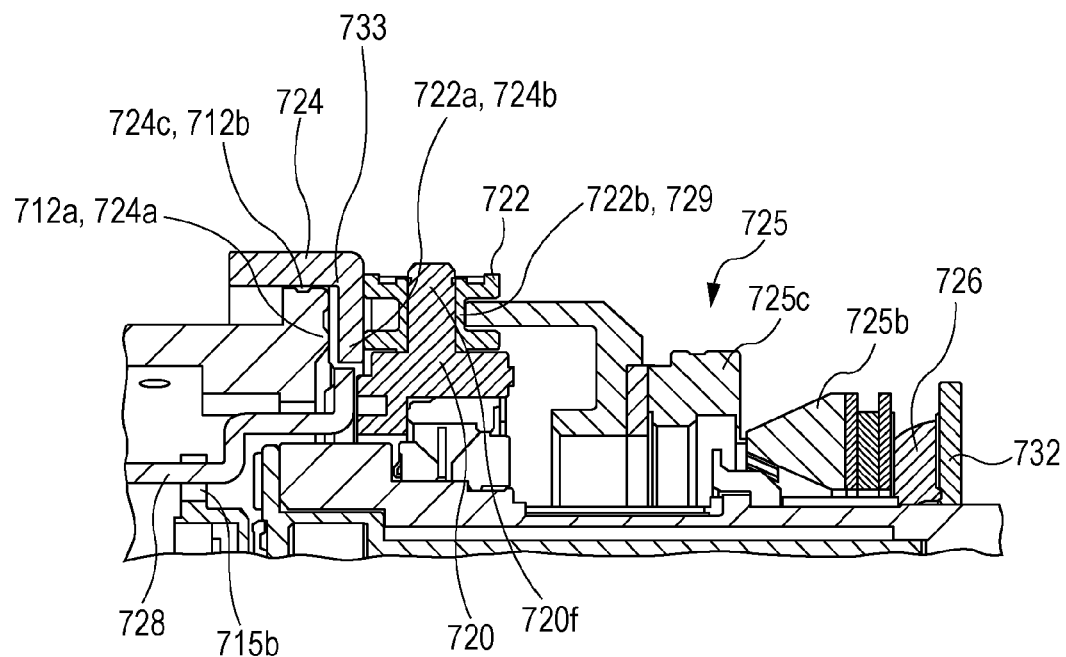
Figure 9:
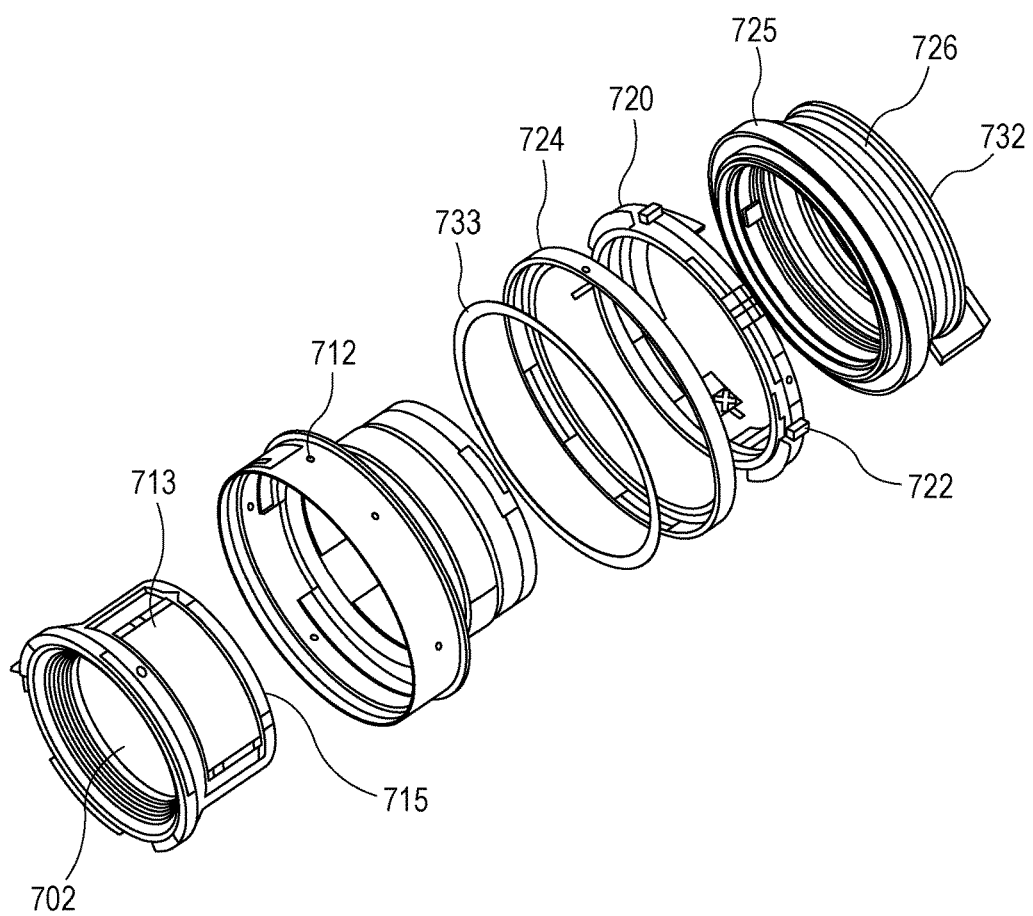
FIG. 9 is a schematic diagram illustrating an embodiment of an optical apparatus.

FIGS. 8A and 8B are main cross-sectional views of an interchangeable lens barrel of a single lens reflex camera as an example of image pickup devices. FIG. 9 is an exploded perspective view of an interchangeable lens barrel of a single lens reflex camera as an example of image pickup devices. A fixing barrel 712, a linear guide barrel 713, and a front lens group barrel 714 are fixed to the quick-detaching mount 711 with a camera. These barrels are fixing members of the interchangeable lens barrel.

The linear guide barrel 713 is provided with a forward guide groove 713a for the focus lens 702 in the optical axis direction. Cam rollers 717a and 717b protruding to the outside in the diameter direction are fixed, with an axial screw 718, to the rear lens group barrel 716 holding the focus lens 702. The cam roller 717a fits in the forward guide groove 713a.

A cam ring 715 turnably fits in the inner circumference of the linear guide barrel 713. Relative displacement between the linear guide barrel 713 and the cam ring 715 is restricted in the optical axis direction by fitting the roller 719 fixed to the cam ring 715 in the circumferential groove 713b of the linear guide barrel 713. The cam ring 715 is provided with a cam groove 715a for the focus lens 702, and the cam roller 717b also fits in the cam groove 715a.

A rotation transmitting ring 720 is disposed on the outer circumference side of the fixing barrel 712 and is held by a ball race 727 so as to be turnable at a fixed position with respect to the fixing barrel 712. The rotation transmitting ring 720 has a shaft 720f radially extending from the rotation transmitting ring 720, and a driven roller 722 is turnably held by the shaft 720f. The large-diameter portion 722a of the driven roller 722 is in contact with the mount side end face 724b of the manual focus ring 724. The small-diameter portion 722b of the driven roller 722 is in contact with a connecting member 729. Six driven rollers 722 are disposed on the outer circumference of the rotation transmitting ring 720 at equal intervals, and each driven roller is disposed as described above.

Low friction sheet (washer member) 733 is disposed at the inner diameter portion of the manual focus ring 724 so as to be held between the mount side end face 712a of the fixing barrel 712 and the front side end face 724a of the manual focus ring 724. The outer diameter surface of the low friction sheet 733 is in a ring shape and fits in the inner diameter portion 724c of the manual focus ring 724, and the inner diameter portion 724c of the manual focus ring 724 further fits in the outer diameter portion 712b of the fixing barrel 712. The low friction sheet 733 reduces the friction in the turning ring mechanism for relatively turning the manual focus ring 724 with respect to the fixing barrel 712 around the optical axis.

The large-diameter portion 722a of the driven roller 722 and the mount side end face 724a of the manual focus ring are in contact with each other with the pressure applied by the force of a wave washer 726 for pressing the ultrasonic motor 725 toward the front of the lens. Similarly, the small-diameter portion 722b of the driven roller 722 and the connecting member 729 are in contact with each other by the force of the wave washer 726 for pressing the ultrasonic motor 725 toward the front of the lens. The wave washer 726 is restricted in the movement toward the mount direction by a washer 732 bayonet-connected to the fixing barrel 712. The spring force (biasing force) generated by the wave washer 726 is transferred to the ultrasonic motor 725 and further to the driven roller 722 and thereby also serves as a pressing force against the mount side end face 712a of the fixing barrel 712 by the manual focus ring 724. That is, the manual focus ring 724 is incorporated so as to be pressed to the mount side end face 712a of the fixing barrel 712 via the low friction sheet 733.

Consequently, when the ultrasonic motor 725 is driven so as to turn with respect to the fixing barrel 712 by controller (not shown), since the connecting member 729 is in a frictional contact with the small-diameter portion 722b of the driven roller 722, the driven roller 722 turns around the shaft 720f. The turning of the driven roller 722 around the shaft 720f results in turning of the rotation transmitting ring 720 around the optical axis (autofocus operation).

When a turning force around the optical axis is applied to the manual focus ring 724 from a manual manipulation input unit (not shown), the mount side end face 724b of the manual focus ring 724 is brought into a pressing-contact with the large-diameter portion 722a of the driven roller 722. As a result, the driven roller 722 turns around the shaft 720f by the frictional force. The turning of the large-diameter portion 722a of the driven roller 722 around the shaft 720f turns the rotation transmitting ring 720 around the optical axis. On this occasion, the friction holding power of a rotor 725c and a stator 725b prevents the ultrasonic motor 725 from being turned (manual focus operation).

The rotation transmitting ring 720 is provided with two focus keys 728 at positions to oppose each other. The focus keys 728 fit in the notches 715b formed at the end portion of the cam ring 715. Consequently, turning of the rotation transmitting ring 720 around the optical axis by the autofocus operation or the manual focus operation is transferred to the cam ring 715 via the focus keys 728 to turn the cum ring around the optical axis. As a result, the rear lens group barrel 716 that is restricted in turning by the cam roller 717b and the forward guide groove 713a moves along the cam groove 715a of the cam ring 715 by the cam roller 717b. Thus, the focus lens 702 is driven to perform focus operation.

Here, an interchangeable lens barrel of a single lens reflex camera has been described as an example of production of the optical apparatus. The present invention can be applied to any optical apparatus having an ultrasonic motor in the driving unit, such as a compact camera or an electronic still camera, regardless of the types of cameras.

Vibratory devices for, for example, conveying or removing particles, powder, or a liquid are widely used in electronic apparatuses. A dust removing device including the piezoelectric material of the present invention will now be described as an example of production of a vibratory device.

The dust removing device as an example of production includes at least a vibrating member provided with the piezoelectric element or the multilayered piezoelectric element.

Figure 10A:
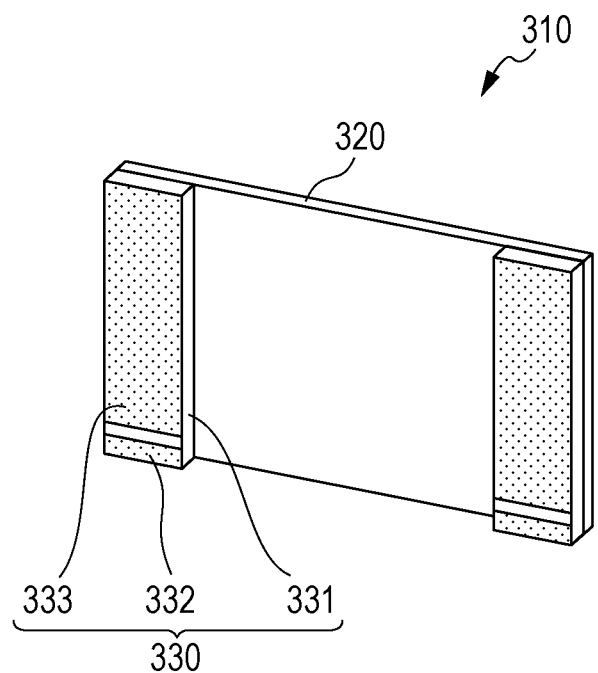
FIGS. 10A and 10B are schematic diagrams illustrating an embodiment when a vibratory device is used in a dust removing device.
Figure 10B:
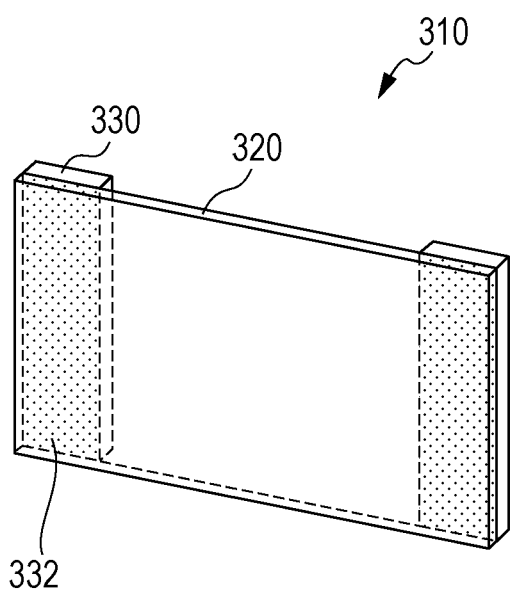

FIGS. 10A and 10B are schematic diagrams illustrating an embodiment of the dust removing device. The dust removing device 310 is constituted of a tabular piezoelectric element 330 and a diaphragm 320. The piezoelectric element 330 may be a multilayered piezoelectric element. The diaphragm 320 may be made of any material. When the dust removing device 310 is used in an optical device, a transparent material or a light-reflective material can be used as the diaphragm 320.

Figure 11A:
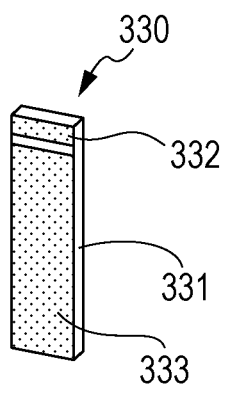
FIGS. 11A to 11C are schematic diagrams illustrating the configuration of a piezoelectric element in a dust removing device.
Figure 11B:
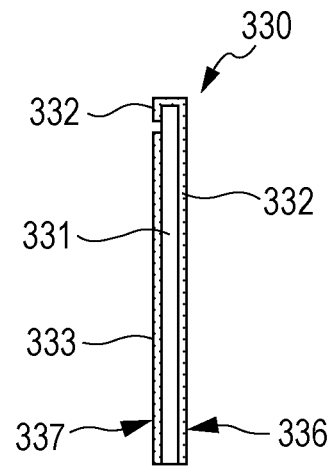
Figure 11C:
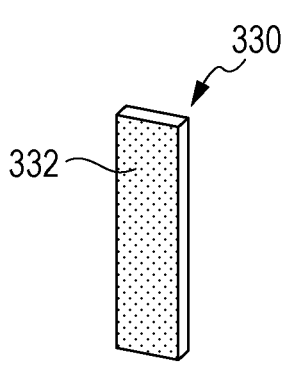

FIGS. 11A to 11C are schematic diagrams illustrating the configuration of the piezoelectric element 330 shown in FIGS. 10A and 10B. FIGS. 11A and 11C illustrate the structures of the front and the rear faces of the piezoelectric element 330, and FIG. 11B illustrates the structure of the side face. As shown in FIGS. 10A and 10B, the piezoelectric element 330 is composed of a piezoelectric material 331, a first electrode 332, and a second electrode 333, and the first electrode 332 and the second electrode 333 are respectively arranged on the surfaces of the tabular piezoelectric material 331. As in the piezoelectric element shown in FIGS. 10A and 10B, the piezoelectric element 330 may be a multilayered piezoelectric element. In such a case, the piezoelectric material 331 has a structure having piezoelectric material layers and internal electrodes alternately arranged, and the internal electrodes are alternately short-circuited with the first electrode 332 or the second electrode 333 to give a driving waveform to each layer of the piezoelectric material with different phases. The face of the first electrode 332 of the piezoelectric element 330 shown in FIG. 11C is a first electrode face 336, and the face of the second electrode 333 of the piezoelectric element 330 shown in FIG. 11A is a second electrode face 337.

Here, the electrode face in the example of production indicates the face of the piezoelectric element on which the electrode is disposed. For example, as shown in FIGS. 11A to 11C, the first electrode 332 may go around to the second electrode face 337.

As shown in FIGS. 10A and 10B, the first electrode face 336 of the piezoelectric element 330 is fixed to the plate face of the diaphragm 320. Stress is generated between the piezoelectric element 330 and the diaphragm 320 by driving the piezoelectric element 330 to generate out-of-plane vibration in the diaphragm. The dust removing device 310 is a device for removing foreign substance such as dust adhered to the surface of the diaphragm 320 by the out-of-plane vibration of the diaphragm 320. The term "out-of-plane vibration" refers to elastic vibration that displace the diaphragm in the optical axis direction, i.e., in the thickness direction of the diaphragm.

Figure 12A:
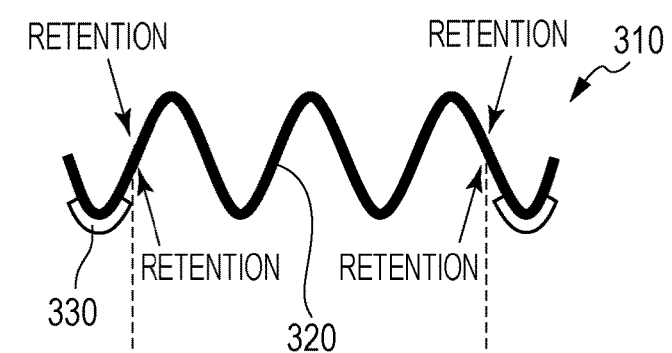
FIGS. 12A and 12B are schematic diagrams illustrating the vibration principle of a dust removing device.
Figure 12B:
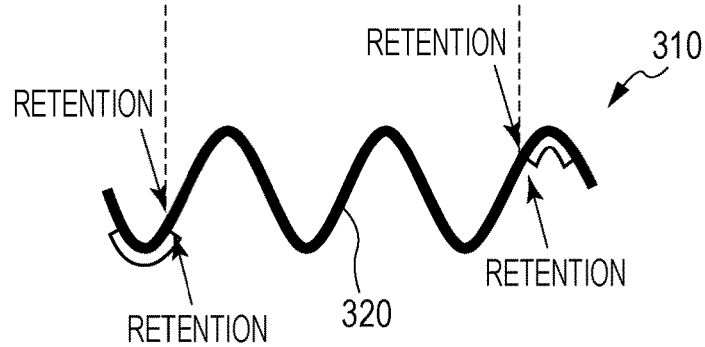

FIGS. 12A and 12B are schematic diagrams illustrating the vibration principle of the dust removing device 310. FIG. 12A shows a state of generating out-of-plane vibration in the diaphragm 320 by applying in-phase alternating electric fields to a pair of piezoelectric elements 330. The polarization direction of the piezoelectric material constituting the pair of piezoelectric elements 330 is the thickness direction of the piezoelectric elements 330. The dust removing device 310 is driven by a seventh vibration mode. FIG. 12B shows a state of generating out-of-plane vibration in the diaphragm 320 by applying reverse-phase alternating voltages having phases opposite by 180° to a pair of piezoelectric elements 330. The dust removing device 310 is driven by a sixth vibration mode. The dust removing device 310 as an example of production can effectively remove dust adhered to the surface of a diaphragm by properly using at least two vibration modes.

Figure 13:
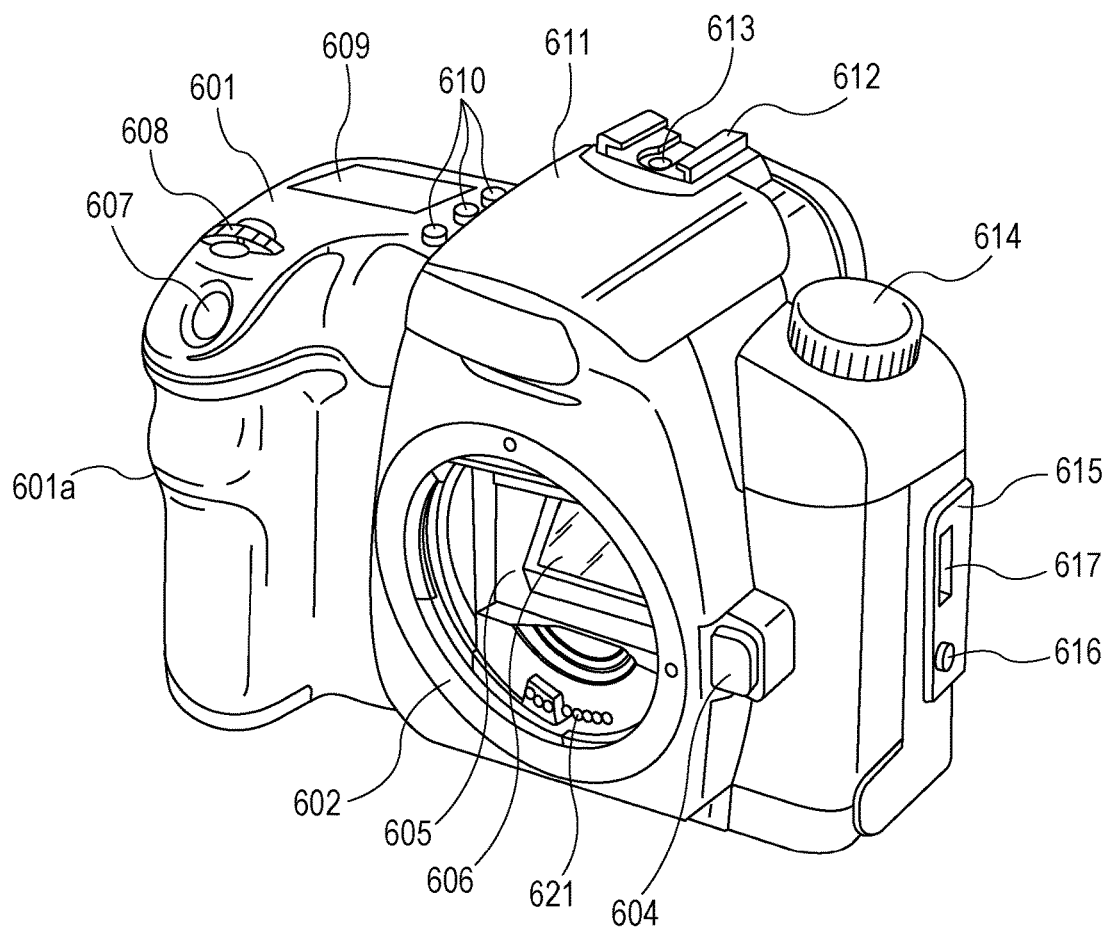
FIG. 13 is a schematic diagram illustrating an embodiment of an image pickup device.
Figure 14:
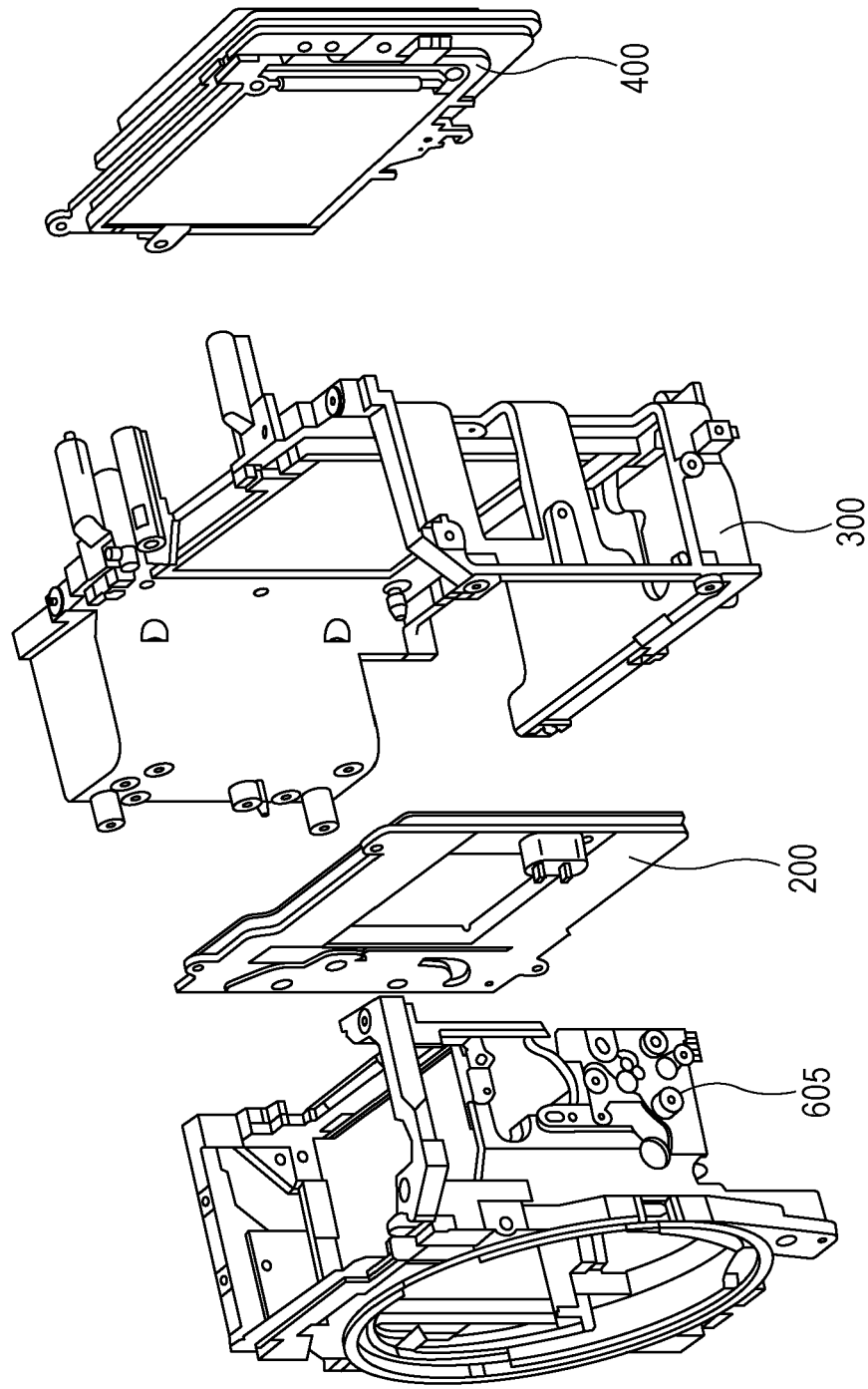
FIG. 14 is a schematic diagram illustrating an embodiment of an image pickup device.

An example of production of an image pickup device will now be described. The image pickup device includes at least the dust removing device and an image pickup element unit. The vibrating member of the dust removing device is disposed on the light-receiving surface side of the image pickup element unit. FIGS. 13 and 14 are diagrams illustrating a digital single lens reflex camera as an example of production of the image pickup device.

FIG. 13 is a front perspective view of a camera body 601 viewed from the object side, in a state in which the image pickup lens unit is removed. FIG. 14 is an exploded perspective view illustrating the schematic structure of the inside of the camera for describing a dust removing device as an example of production and the surrounding structure of a pickup unit 400.

A mirror box 605 into which image pickup light beams that passed through the image pickup lens are guided is disposed inside the camera body 601. Main mirror (quick return mirror) 606 is disposed inside the mirror box 605. The main mirror 606 can take a state in which the main mirror 606 is held at an angle of 45° with respect to the image pickup optical axis for guiding image pickup light beams to the direction of the penta roof mirror (not shown) and a state in which the main mirror 606 is held at a position evacuated from image pickup light beams for guiding the image pickup light beams to the direction of the image pickup element (not shown).

The mirror box 605 and a shutter unit 200 are disposed on the object side of the body chassis 300 serving as the skeleton of the camera body in this order from the object side. Furthermore, an image pickup unit 400 is disposed on the photographer side of the body chassis 300. The image pickup unit 400 is set to the clamp face of the mount portion 602 serving as the basis for setting the image pickup lens unit such that the image pickup face of the image pickup element is parallel to the clamp face with a predetermined distance therebetween.

Herein, a digital single lens reflex camera has been described as an example of production of the image pickup device. The image pickup device may be, for example, an image pickup lens interchangeable camera such as a mirror-less digital single lens camera not having the mirror box 605. The present invention can also be applied to any apparatus required to remove dust adhering to the surface of, in particular, the optical part among various image pickup devices such as image pickup unit interchangeable video cameras, copiers, facsimile machines, and scanners and electronic electric apparatuses having image pickup devices.

An example of production of an electronic apparatus will now be described. The electronic apparatus as an example of production includes a piezoelectric acoustic component having the piezoelectric element or the multilayered piezoelectric element. Examples of the piezoelectric acoustic component include loudspeakers, buzzers, microphones, and surface acoustic wave (SAW) elements.

Figure 15:
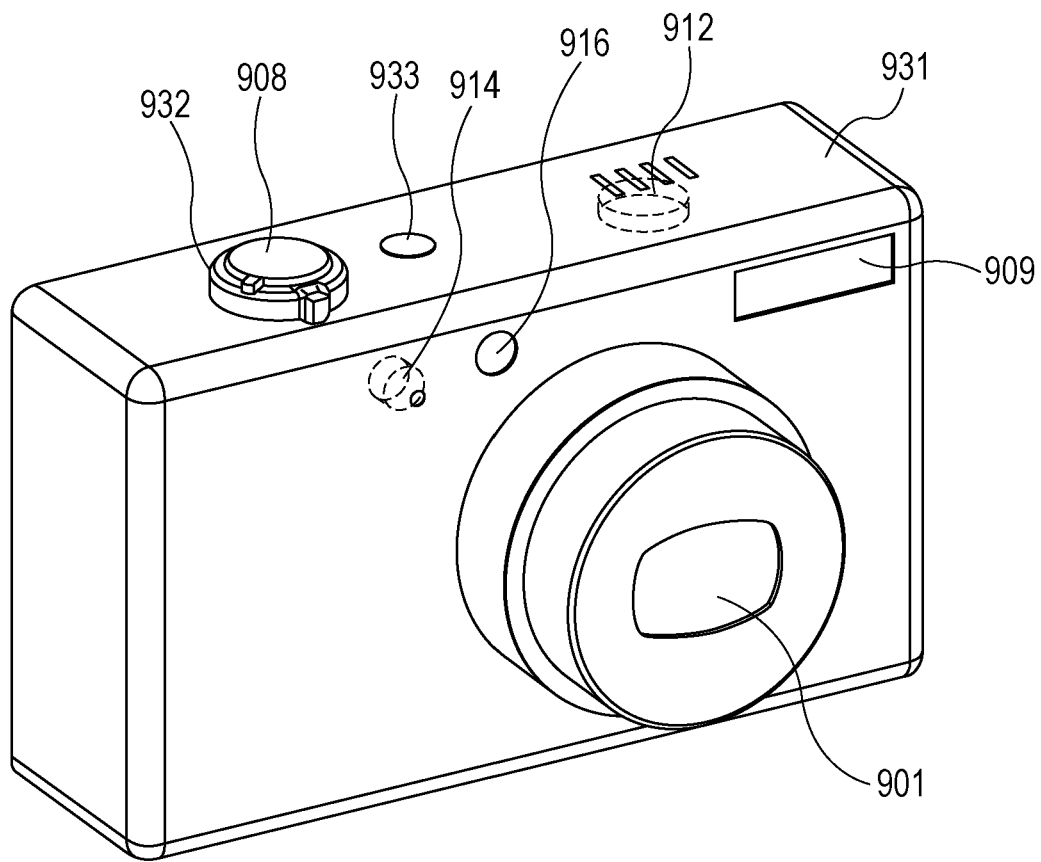
FIG. 15 is a schematic diagram illustrating an embodiment of an electronic apparatus.

FIG. 15 is a perspective general view of a digital camera body 931, an example of production of the electronic apparatus, viewed from the front. An optical device 901, a microphone 914, a stroboscope light emitting unit 909, and an assist light unit 916 are disposed on the front of the body 931. The microphone 914 is incorporated in the inside of the body and is therefore indicated by a dashed line. A hole is provided in the body on the front of the microphone 914 for picking up sounds from the outside.

On the upper face of the body 931, a power button 933, a loudspeaker 912, a zoom lever 932, and a release button 908 for performing the focusing operation are arranged. The loudspeaker 912 is incorporated in the inside of the body 931 and is therefore indicated by a dashed line. Holes are provided in the body on the front of the loudspeaker 912 for transmitting sounds to the outside.

The piezoelectric acoustic component is used in at least one of the microphone 914, the loudspeaker 912, and the surface acoustic wave element.

Herein, a digital camera has been described as an example of production of the electronic apparatus. The present invention can also be applied to electronic apparatuses having various piezoelectric acoustic components such as sound reproducers, recorders, cellular phones, and information terminals.

As described above, the piezoelectric element including the piezoelectric material of the present invention can be suitably used in liquid discharge heads, liquid discharge devices, ultrasonic motors, optical apparatuses, vibratory devices, dust removing devices, image pickup devices, and electronic apparatuses.

The use of the piezoelectric material of the present invention can provide a liquid discharge head having a nozzle density and a discharge rate that are equivalent to or higher than those in the case of using a piezoelectric material containing lead.

The use of the piezoelectric material of the present invention can provide a liquid discharge device having a discharge rate and a discharge precision that are equivalent to or higher than those in the case of using a piezoelectric element containing lead.

The use of the piezoelectric material of the present invention can provide an ultrasonic motor having a driving power and durability that are equivalent to or higher than those in the case of using a piezoelectric material containing lead.

The use of the piezoelectric material of the present invention can provide an optical apparatus having durability and an operation precision that are equivalent to or higher than those in the case of using a piezoelectric element containing lead.

The use of the piezoelectric material of the present invention can provide a vibratory device having a vibration ability and durability that are equivalent to or higher than those in the case of using a piezoelectric element containing lead.

The use of the piezoelectric material of the present invention can provide a dust removing device having a dust removing efficiency and durability that are equivalent to or higher than those in the case of using a piezoelectric element containing lead.

The use of the piezoelectric material of the present invention can provide an image pickup device having a dust removing function that is equivalent to or higher than that in the case of using a piezoelectric element containing lead.

The use of a piezoelectric acoustic component including the piezoelectric material of the present invention can provide an electronic apparatus having a sound-producing ability that is equivalent to or higher than that in the case of using a piezoelectric element containing lead.

The piezoelectric material of the present invention can be used not only in liquid discharge heads and motors but also in devices such as ultrasonic vibrators, piezoelectric actuators, piezoelectric sensors, and ferroelectric memories.

EXAMPLES

The present invention will now be more specifically described by Examples, but is not limited to the following Examples. A piezoelectric material of the present invention was produced by the following procedure.

FIG. 1 is a graph showing a relationship between the x-values and the y-values of piezoelectric materials in Examples 1 to 22 of the present invention and in Comparative Examples 1 to 9, which will be described below.

Example 1

Barium titanate (BT-01, manufactured by Sakai Chemical Industry Co., Ltd.) having an average particle diameter of 100 nm, calcium titanate (CT-03, manufactured by Sakai Chemical Industry Co., Ltd.) having an average particle diameter of 300 nm, calcium zirconate (CZ-03, manufactured by Sakai Chemical Industry Co., Ltd.) having an average particle diameter of 300 nm were weighed at a molar ratio of 87.5:5.1:7.4. In order to adjust the ratio "a" of the molar amount of Ba and Ca at the A site to the molar amount Ti and Zr at the B site, 0.007 mol of barium oxalate $BaC_2O_3$ was added to the mixture. The mixture of these powders was mixed by dry blending with a ball mill for 24 hours. The resulting mixed powder was granulated by spraying manganese(II) acetate in an amount of 0.18 parts by weight of Mn to the mixed powder on a metal basis and a PVA binder in an amount of 3 parts by weight to the mixed powder to the mixed powder using a spray dryer such that the manganese(II) acetate and the PVA binder adhere to the mixed powder surfaces.

A mold was filled with the resulting granulated powder, and the granulated powder was formed into a disk-shaped compact by applying a molding pressure of 200 MPa to the mold with a press molding machine. The compact may be further pressed with a cold isostatic pressing molding machine.

The resulting compact was put in an electric furnace, was held at a maximum temperature of 1380° C. for 5 hours, and was sintered in the atmosphere over 24 hours in total.

The average equivalent circular diameter and the relative density of the resulting crystal grains constituting a ceramic were evaluated and were 2.3 μm and 98.8%, respectively. The crystal grains were mainly observed with a polarizing microscope, but the crystal grains having a small grain diameter were observed with a scanning electron microscope (SEM). The average equivalent circular diameter was calculated from the observation results. The density was evaluated by an Archimedes's method.

The resulting ceramic was ground so as to have a thickness of 0.5 mm, and the crystal structure was analyzed by X-ray diffraction. Only a peak corresponding to a perovskite structure was observed.

The composition was evaluated by X-ray fluorescence analysis. The result demonstrates that 0.18 parts by weight of Mn was incorporated in a composition represented by a chemical formula: $(Ba_{0.875}Ca_{0.125})_{1.005}(Ti_{0.926}Zr_{0.074})O_3$. This means that the composition after sintering coincides with the weighed composition. The amounts of elements other than Ba, Ca, Ti, Zr, and Mn were each lower than the detection limit, i.e., less than 1 part by weight. Subsequently, the valence of Mn in the sample was evaluated. The magnetic susceptibility at 2 to 60 K was measured with a superconducting quantum interference device (SQUID), and the valence was determined from the temperature dependability of the magnetic susceptibility. The majority of Mn atoms had a valence of 4+.

Furthermore, the crystal grains were observed again. There was no significant difference in average equivalent circular diameter between before and after grinding.

Examples 2 to 25

Barium titanate (BT-01, manufactured by Sakai Chemical Industry Co., Ltd.) having an average particle diameter of 100 nm, calcium titanate (CT-03, manufactured by Sakai Chemical Industry Co., Ltd.) having an average particle diameter of 300 nm, and calcium zirconate (CZ-03, manufactured by Sakai Chemical Industry Co., Ltd.) having an average particle diameter of 300 nm were weighed at molar ratios shown in Table 1. In order to adjust the ratio "a" of the molar amount of Ba and Ca at the A site to the molar amount Ti and Zr at the B site, barium oxalate $BaC_2O_3$ was added to the mixtures in amounts shown in Table 1. The mixtures of these powders were each mixed by dry blending with a ball mill for 24 hours. Incidentally, in Example 18, Si and Cu were further added to the mixed powder in a total amount of 1.0 part by weight on a metal basis, and in Example 21, Y was further added to the mixed powder in an amount of 1.0 part by weight on a metal basis. The resulting mixed powders were each granulated by spraying manganese(II) acetate in amounts of Mn shown Table 1 to the mixed powder on a metal basis and a PVA binder in an amount of 3 parts by weight to the mixed powder using a spray dryer such that the manganese(II) acetate and the PVA binder adhere to the mixed powder surfaces.

A mold was filled with the resulting granulated powder, and the granulated powder was formed into a disk-shaped compact by applying a molding pressure of 200 MPa with a press molding machine. The compact may be further pressed with a cold isostatic pressing molding machine.

The resulting compact was put in an electric furnace, was held at a maximum temperature of 1300° C. to 1480° C. for 5 hours, and was sintered in the atmosphere over 24 hours in total. The maximum temperature was raised with an increase in amount of Ca.

The average equivalent circular diameter and the relative density of the resulting crystal grains constituting each ceramic were evaluated. The results are shown in Table 2. The crystal grains were mainly observed with a polarizing microscope. Crystal grains having a small grain diameter were observed with a scanning electron microscope (SEM). The average equivalent circular diameter was calculated from the observation results. The density was evaluated by an Archimedes's method.

The resulting ceramic was ground so as to have a thickness of 0.5 mm, and the crystal structure was analyzed by X-ray diffraction. Only a peak corresponding to a perovskite structure was observed in each sample.

The composition was evaluated by X-ray fluorescence analysis. The results are shown in Table 3. The "accessory component" in the table indicates elements other than Ba, Ca, Ti, Zr, and Mn, and "0.00" means that the amount is lower than the detection limit. The results demonstrate that the composition after sintering coincides with the weighed composition. Subsequently, the valence of Mn in each sample was evaluated. The magnetic susceptibility at 2 to 60 K was measured with a superconducting quantum interference device (SQUID), and the valence was determined from the temperature dependability of the magnetic susceptibility. The majority of Mn atoms in each sample had a valence of 4+.

Furthermore, the crystal grains were observed again. There were no significant differences in size and condition of the crystal grains between after sintering and after grinding.

Comparative Examples 1 to 10

The same raw material powders as those used in Examples 1 to 25 were weighed at molar ratios shown in Table 1 and were mixed by dry blending with a ball mill for 24 hours. In Comparative Example 5, Y was mixed with the mixed powder as an accessory component in an amount of 1.2 parts by weight on a metal basis. The resulting mixed powders were granulated by spraying manganese(II) acetate in amounts of Mn shown Table 1 to the mixed powder on a metal basis and a PVA binder in an amount of 3 parts by weight to the mixed powder using a spray dryer such that the manganese(II) acetate and the PVA binder adhere to the mixed powder surfaces.

Ceramics were produced using the resulting granulated powders under the same conditions as in Examples 1 to 25. The average equivalent circular diameter and the relative density of the crystal grains constituting each ceramic were evaluated. The results are shown in Table 2. The crystal grains and the relative density were evaluated as in Examples 1 to 25.

The resulting ceramics were each ground so as to have a thickness of 0.5 mm, and the crystal structure was analyzed by X-ray diffraction. Only a peak corresponding to a perovskite structure was observed in each sample of Comparative Examples 1 to 10.

The composition was evaluated by X-ray fluorescence analysis. The results are shown in Table 3. The results demonstrate that the composition after sintering coincides with the weighed composition in every sample.

TABLE 2

| | Average equivalent circular diameter [μm] | Relative density [%] |
|---|---|---|
| Example 1 | 2.3 | 98.8 |
| Example 2 | 4.7 | 99.3 |
| Example 3 | 1.3 | 98.1 |
| Example 4 | 3.5 | 98.6 |
| Example 5 | 6.4 | 98.1 |
| Example 6 | 2.9 | 97.2 |
| Example 7 | 4.3 | 98.4 |
| Example 8 | 5.1 | 98.1 |
| Example 9 | 6.2 | 98.3 |
| Example 10 | 5.4 | 98.8 |
| Example 11 | 6.1 | 98.6 |
| Example 12 | 7.3 | 98.4 |
| Example 13 | 6.8 | 98.4 |
| Example 14 | 7.1 | 98.6 |
| Example 15 | 7.1 | 98.8 |
| Example 16 | 9.8 | 98.8 |
| Example 17 | 5.6 | 97.9 |
| Example 18 | 4.1 | 98.4 |
| Example 19 | 4.7 | 98.3 |
| Example 20 | 5.5 | 98.6 |
| Example 21 | 0.9 | 98.3 |
| Example 22 | 7.2 | 98.7 |
| Example 23 | 1.4 | 98.4 |
| Example 25 | 4.1 | 98.6 |
| Comparative Example 1 | 1.8 | 96.9 |
| Comparative Example 2 | 4.3 | 97.7 |
| Comparative Example 3 | 7.9 | 99.7 |
| Comparative Example 4 | 6.9 | 97.7 |
| Comparative Example 5 | 13.5 | 97.0 |
| Comparative Example 6 | 3.4 | 91.8 |
| Comparative Example 7 | 0.7 | 96.5 |
| Comparative Example 8 | 0.8 | 91.8 |

TABLE 1

| | $BaTiO_3$ [mol] | $CaTiO_3$ [mol] | $CaZrO_3$ [mol] | Mn [part by weight] | Accessory component other than Mn [part by weight] | $BaC_2O_4$ [mol] | a |
|---|---|---|---|---|---|---|---|
| Example 1 | 87.5 | 5.1 | 7.4 | 0.18 | 0.0 | 0.007 | 1.005 |
| Example 2 | 84.6 | 8.0 | 7.4 | 0.18 | 0.0 | 0.008 | 1.006 |
| Example 3 | 87.5 | 7.4 | 5.1 | 0.18 | 0.0 | 0.008 | 1.006 |
| Example 4 | 84.6 | 10.3 | 5.1 | 0.18 | 0.0 | 0.008 | 1.005 |
| Example 5 | 87.5 | 8.4 | 4.1 | 0.18 | 0.0 | 0.008 | 1.006 |
| Example 6 | 84.6 | 11.3 | 4.1 | 0.18 | 0.0 | 0.010 | 1.007 |
| Example 7 | 86.0 | 8.0 | 6.0 | 0.12 | 0.0 | 0.005 | 1.003 |
| Example 8 | 86.0 | 8.0 | 6.0 | 0.18 | 0.0 | 0.008 | 1.006 |
| Example 9 | 86.0 | 8.0 | 6.0 | 0.18 | 0.0 | 0.007 | 1.005 |
| Example 10 | 86.0 | 8.0 | 6.0 | 0.24 | 0.0 | 0.010 | 1.008 |
| Example 11 | 86.0 | 8.0 | 6.0 | 0.30 | 0.0 | 0.012 | 1.010 |
| Example 12 | 86.0 | 9.5 | 4.5 | 0.12 | 0.0 | 0.006 | 1.003 |
| Example 13 | 86.0 | 9.5 | 4.5 | 0.18 | 0.0 | 0.009 | 1.006 |
| Example 14 | 86.0 | 9.5 | 4.5 | 0.18 | 0.0 | 0.008 | 1.005 |
| Example 15 | 86.0 | 9.5 | 4.5 | 0.24 | 0.0 | 0.011 | 1.008 |
| Example 16 | 86.0 | 9.5 | 4.5 | 0.30 | 0.0 | 0.013 | 1.010 |
| Example 17 | 87.5 | 7.7 | 4.8 | 0.18 | 0.0 | 0.008 | 1.006 |
| Example 18 | 84.6 | 10.6 | 4.8 | 0.18 | 1.0 | 0.009 | 1.006 |
| Example 19 | 86.0 | 8.9 | 5.1 | 0.18 | 0.0 | 0.008 | 1.005 |
| Example 20 | 86.0 | 9.2 | 4.8 | 0.18 | 0.0 | 0.003 | 1.000 |
| Example 21 | 84.6 | 11.1 | 4.3 | 0.12 | 1.0 | 0.003 | 1.000 |
| Example 22 | 86.0 | 8.0 | 6.0 | 0.40 | 0.0 | 0.011 | 1.009 |
| Example 23 | 87.0 | 7.6 | 5.4 | 0.24 | 0.0 | 0.007 | 1.005 |
| Example 25 | 84.6 | 9.4 | 6.0 | 0.24 | 0.0 | 0.009 | 1.006 |
| Comparative Example 1 | 88.0 | 4.5 | 7.5 | 0.10 | 0.0 | 0.025 | 1.023 |
| Comparative Example 2 | 88.0 | 8.0 | 4.0 | 0.18 | 0.0 | 0.005 | 1.003 |
| Comparative Example 3 | 86.0 | 6.5 | 7.5 | 0.12 | 0.0 | 0.005 | 1.003 |
| Comparative Example 4 | 86.0 | 10.0 | 4.0 | 0.12 | 1.2 | 0.009 | 1.006 |
| Comparative Example 5 | 86.0 | 9.5 | 4.5 | 0.08 | 0.0 | 0.000 | 0.994 |
| Comparative Example 6 | 86.0 | 8.0 | 6.0 | 0.45 | 0.0 | 0.011 | 1.009 |
| Comparative Example 7 | 68.0 | 25.5 | 6.5 | 0.18 | 0.0 | 0.010 | 1.006 |
| Comparative Example 8 | 90.0 | 4.0 | 6.0 | 0.18 | 0.0 | 0.014 | 1.012 |
| Comparative Example 9 | 86.0 | 12.0 | 2.0 | 0.18 | 0.0 | 0.008 | 1.005 |
| Comparative Example 10 | 85.0 | 15.0 | 0.0 | 0.18 | 0.0 | 0.003 | 1.000 |

TABLE 2-continued

|  | Average equivalent circular diameter [μm] | Relative density [%] |
|---|---|---|
| Comparative Example 9 | 4.1 | 98.4 |
| Comparative Example 10 | 5.1 | 99.1 |

TABLE 3

|  | x | y | a | Mn [% by weight] | Accessory component [% by weight] |
|---|---|---|---|---|---|
| Example 1 | 0.125 | 0.074 | 1.005 | 0.18 | 0.00 |
| Example 2 | 0.154 | 0.074 | 1.006 | 0.18 | 0.00 |
| Example 3 | 0.125 | 0.051 | 1.006 | 0.18 | 0.00 |
| Example 4 | 0.154 | 0.051 | 1.005 | 0.18 | 0.00 |
| Example 5 | 0.125 | 0.041 | 1.006 | 0.18 | 0.00 |
| Example 6 | 0.154 | 0.041 | 1.007 | 0.18 | 0.00 |
| Example 7 | 0.140 | 0.060 | 1.003 | 0.12 | 0.00 |
| Example 8 | 0.140 | 0.060 | 1.006 | 0.18 | 0.00 |
| Example 9 | 0.140 | 0.060 | 1.005 | 0.18 | 0.00 |
| Example 10 | 0.140 | 0.060 | 1.008 | 0.24 | 0.00 |
| Example 11 | 0.140 | 0.060 | 1.010 | 0.30 | 0.00 |
| Example 12 | 0.140 | 0.045 | 1.003 | 0.12 | 0.00 |
| Example 13 | 0.140 | 0.045 | 1.006 | 0.18 | 0.00 |
| Example 14 | 0.140 | 0.045 | 1.005 | 0.18 | 0.00 |
| Example 15 | 0.140 | 0.045 | 1.008 | 0.24 | 0.00 |
| Example 16 | 0.140 | 0.045 | 1.010 | 0.30 | 0.00 |
| Example 17 | 0.125 | 0.048 | 1.006 | 0.18 | 0.00 |
| Example 18 | 0.154 | 0.048 | 1.006 | 0.18 | 1.00 |
| Example 19 | 0.140 | 0.051 | 1.005 | 0.18 | 0.00 |
| Example 20 | 0.140 | 0.048 | 1.000 | 0.18 | 0.00 |
| Example 21 | 0.154 | 0.043 | 1.000 | 0.12 | 1.00 |
| Example 22 | 0.140 | 0.060 | 1.009 | 0.40 | 0.00 |
| Example 23 | 0.130 | 0.054 | 1.005 | 0.24 | 0.00 |
| Example 25 | 0.154 | 0.060 | 1.006 | 0.24 | 0.00 |
| Comparative Example 1 | 0.120 | 0.075 | 1.023 | 0.10 | 0.00 |
| Comparative Example 2 | 0.120 | 0.040 | 1.003 | 0.18 | 0.00 |
| Comparative Example 3 | 0.140 | 0.075 | 1.003 | 0.12 | 0.00 |
| Comparative Example 4 | 0.140 | 0.040 | 1.006 | 0.12 | 1.20 |
| Comparative Example 5 | 0.140 | 0.045 | 0.994 | 0.08 | 0.00 |
| Comparative Example 6 | 0.140 | 0.060 | 1.009 | 0.45 | 0.00 |
| Comparative Example 7 | 0.320 | 0.065 | 1.006 | 0.18 | 0.00 |
| Comparative Example 8 | 0.100 | 0.060 | 1.012 | 0.18 | 0.00 |
| Comparative Example 9 | 0.140 | 0.020 | 1.005 | 0.18 | 0.00 |
| Comparative Example 10 | 0.150 | 0.000 | 1.000 | 0.18 | 0.00 |

Production of Piezoelectric Element and Static Characteristics Evaluation

Examples 1 to 25

Piezoelectric elements were produced using the piezoelectric materials in Examples 1 to 25.

A gold electrode having a thickness of 400 nm was formed on each surface of the disk-shaped ceramic by DC sputtering. Incidentally, a titanium adhesive layer having a thickness of 30 nm was formed between the electrode and the ceramic. The resulting ceramic provided with electrodes was cut into a strip-like piezoelectric element of 10×2.5×0.5 mm.

The resulting piezoelectric element was polarized by applying an electric field of 1 kV/mm to the piezoelectric element on a hot plate set to a surface temperature of 60° C. to 100° C. for 30 minutes.

The piezoelectric elements including the piezoelectric materials of the present invention and the piezoelectric elements including the piezoelectric materials of Comparative Examples were evaluated for the static characteristics, i.e., the Curie temperature, piezoelectric constant $d_{31}$, and mechanical quality factor after polarization treatment. The results are shown in Table 4. The Curie temperature shown in the table was determined from the temperature showing the maximum dielectric constant by measuring dielectric constants with changing the measurement temperature using a small AC electric field having a frequency of 1 kHz. The piezoelectric constant $d_{31}$ was determined by a resonance-antiresonance method, and its absolute value is shown in the table. The measurement was performed at room temperature (25° C.)

Table 4 also shows the ratio of the abundance of Ba and Ca to the abundance of Ti, Zr, and Mn, (Ba+Ca)/(Ti+Zr+Mn).

TABLE 4

|  | Curie temperature [° C.] | Piezoelectric constant $\|d_{31}\|$ [pm/V] | Mechanical quality factor | (Ba + Ca)/ (Ti + Zr + Mn) |
|---|---|---|---|---|
| Example 1 | 100 | 131 | 860 | 0.9977 |
| Example 2 | 102 | 112 | 910 | 0.9987 |
| Example 3 | 106 | 108 | 1010 | 0.9987 |
| Example 4 | 106 | 103 | 1040 | 0.9978 |
| Example 5 | 108 | 93 | 970 | 0.9987 |
| Example 6 | 108 | 90 | 870 | 0.9998 |
| Example 7 | 107 | 115 | 960 | 0.9981 |
| Example 8 | 108 | 111 | 1220 | 0.9987 |
| Example 9 | 108 | 113 | 1250 | 0.9977 |
| Example 10 | 108 | 106 | 1320 | 0.9983 |
| Example 11 | 110 | 104 | 1370 | 0.9979 |
| Example 12 | 112 | 99 | 880 | 0.9982 |
| Example 13 | 112 | 95 | 910 | 0.9987 |
| Example 14 | 112 | 97 | 1000 | 0.9977 |
| Example 15 | 110 | 93 | 1120 | 0.9983 |
| Example 16 | 112 | 92 | 1300 | 0.9979 |
| Example 17 | 110 | 94 | 1270 | 0.9987 |
| Example 18 | 112 | 91 | 1130 | 0.9988 |
| Example 19 | 110 | 100 | 1280 | 0.9977 |
| Example 20 | 112 | 92 | 1340 | 0.9927 |
| Example 21 | 112 | 90 | 850 | 0.9952 |
| Example 22 | 111 | 103 | 1420 | 0.9924 |
| Example 23 | 105 | 109 | 1000 | 0.9953 |
| Example 25 | 106 | 107 | 980 | 0.9964 |
| Comparative Example 1 | 96 | 123 | 780 | 1.0189 |
| Comparative Example 2 | 102 | 83 | 1200 | 0.9957 |
| Comparative Example 3 | 95 | 130 | 120 | 0.9981 |
| Comparative Example 4 | 114 | 81 | 1100 | 1.0012 |
| Comparative Example 5 | 114 | 85 | 150 | 0.9942 |
| Comparative Example 6 | 112 | 75 | 1300 | 0.9948 |
| Comparative Example 7 | 106 | 21 | 710 | 0.9993 |
| Comparative Example 8 | 126 | 40 | 280 | 1.0046 |
| Comparative Example 9 | 128 | 71 | 1130 | 0.9978 |
| Comparative Example 10 | 130 | 48 | 900 | 0.9928 |

Herein, the piezoelectric elements in Examples 8 and 9, having the same values of x and y and the same Mn contents, but having different values of a, were compared to each other. Similarly, the piezoelectric elements in Examples 13 and 14, having the same values of x and y and the same Mn contents, but having different values of a, were compared to each other. The piezoelectric elements having a smaller value of a, i.e., the piezoelectric elements in Examples 9 and 14, were excellent in both piezoelectric constant and mechanical quality factor. In Examples 1 to 21, the ratios of the abundance of Ba and Ca to the abundance of Ti, Zr, and Mn, (Ba+Ca)/(Ti+Zr+Mn), were 0.992 or more and 0.999 or less.

In all Examples, piezoelectric elements produced by baking a silver paste showed characteristics equivalent to those produced by baking a gold paste.

Comparative Examples 1 to 10

Piezoelectric elements were produced using the ceramics in Comparative Examples 1 to 9.

The production and evaluation of the elements were performed as in Examples 1 to 25.

The ceramics in Comparative Examples 1 and 3 contained a large amount of Zr, 7.5% (y=0.075), and thereby had low Curie temperatures of 96° C. and 95° C., respectively, resulting in a narrow temperature range at which the piezoelectric element can be used. The ceramics in Comparative Examples 2 and 4 contained a small amount of Zr, 4.0% (y=0.040), and thereby had low piezoelectric constants. The ceramic in Comparative Example 5 contained a small amount of Mn, 0.08 parts by weight, and had a small value of a, 0.994, i.e., lower than 1, and thereby caused abnormal growth of grains during the sintering to give a large average equivalent circular diameter of 13.5 μm, resulting in a small piezoelectric constant and also a small mechanical quality factor of 150. Since the ceramic in Comparative Example 6 contained a large amount of Mn, 0.45 parts by weight, though the mechanical quality factor was large, 1300, the piezoelectric constant was small. Since the ceramic in Comparative Example 7 contained a large amount of Ca, 32.0% (x=0.320), the sintering did not sufficiently proceeded to give insufficient grain growth, resulting in a small piezoelectric constant $d_{31}$ of 21 [pm/V]. The ceramic in Comparative Example 8 contained a small amount of Ca, 10% (x=0.100), and had a large value of a, 1.014, and the sintering did not sufficiently proceeded to give a small average equivalent circular diameter of 0.7 μm, resulting in a small piezoelectric constant $d_{31}$ of 40 [pm/V] and a small mechanical quality factor of 280. The ceramic in Comparative Example 9 contained a small amount of Zr, 2.0% (x=0.020), and thereby had a small piezoelectric constant $d_{31}$ of 71 [pm/V]. The ceramic in Comparative Example 10 contained 0% of Zr and thereby had a further smaller piezoelectric constant $d_{31}$ of 48 [pm/V] than that of the ceramic in Comparative Example 9.

Comparative Example 11

As in Examples 1 to 25, barium titanate, calcium zirconate, and barium zirconate (manufactured by Nippon Chemical Industrial Co., Ltd.) having an average particle diameter of 300 nm were weighed at a molar ratio, $BaTiO_3$:$CaZrO_3$:$BaZrO_3$=86.7:10.0:3.3, and were mixed by dry blending with a ball mill for 24 hours. The resulting mixed powder was granulated by spraying manganese(II) acetate in amount of 0.24 parts by weight of Mn to the mixed powder on a metal basis and a PVA binder in an amount of 3 parts by weight to the mixed powder using a spray dryer such that the manganese(II) acetate and the PVA binder adhere to the mixed powder surfaces.

A ceramic was produced using the resulting granulated powder under the same conditions as in Examples 1 to 25. The average equivalent circular diameter and the relative density of the crystal grains constituting the ceramic were evaluated. As a result, the average equivalent circular diameter was 1.1 μm and the relative density was 97.9%.

The resulting ceramic was ground so as to have a thickness of 0.5 mm, and the crystal structure was analyzed by X-ray diffraction. Only a peak corresponding to a perovskite structure was observed.

The composition was evaluated by X-ray fluorescence analysis. The results demonstrate that the composition after sintering coincides with the weighed composition in every sample.

A gold electrode having a thickness of 400 nm was formed on each surface of the disk-shaped ceramic by DC sputtering. Incidentally, a titanium adhesive layer having a thickness of 30 nm was formed between the electrode and the ceramic. The resulting ceramic provided with electrodes was cut into a strip-like piezoelectric element of 10×2.5×0.5 mm.

The resulting piezoelectric element was polarized by applying an electric field of 1 kV/mm to the piezoelectric element on a hot plate set to a surface temperature of 80° C. for 30 minutes.

Evaluation of Durability of Piezoelectric Element

In order to confirm the durability of piezoelectric elements, the piezoelectric elements prepared in Example 23 and Comparative Example 11 were placed in a thermostatic chamber and were subjected to a thermal cycle test of repeating a thermal cycle consisting of 25° C.→−20° C.→50° C.→25° C. 100 times. The piezoelectric constants $d_{31}$ before and after the thermal cycle test were evaluated. The piezoelectric element in Example 23 showed a piezoelectric constant change (=(piezoelectric constant $d_{31}$ after the test/piezoelectric constant $d_{31}$ before the test)−1) was −3%, whereas the piezoelectric element in Comparative Example 11 showed a piezoelectric constant change of −20% or more. Every sample in Examples did not have the crystal phase transition temperature in the range of −25° C. to 100° C. Consequently, it is believed that the temperature change of −25° C. to 50° C. caused less deterioration in polarization. In contrast, the piezoelectric element in Comparative Example 11 had the crystal phase transition temperature within the range of −25° C. to 50° C. Consequently, it is believed that a large deterioration in polarization was caused by repeating the change in temperature in the range including the crystal phase transition temperature many times to reduce the piezoelectric constant. That is, a piezoelectric ceramic having a crystal phase transition temperature in the range of −25° C. to 100° C. does not have sufficient durability as an element.

Multilayered Piezoelectric Element According to Example 1

Barium titanate particles (BT-01, manufactured by Sakai Chemical Industry Co., Ltd.) having an average particle diameter of 100 nm, calcium titanate particles (CT-03, manufactured by Sakai Chemical Industry Co., Ltd.) having an average particle diameter of 300 nm, calcium zirconate particles (CZ-03, manufactured by Sakai Chemical Industry Co., Ltd.) having an average particle diameter of 300 nm, barium oxalate, and trimanganese tetraoxide ($Mn_3O_4$) were weighed so as to give the composition of Example 1 shown in Table 1. The weighed raw material powders were mixed with a ball mill overnight to give a mixed powder.

The resulting mixed powder was mixed with PVB, and the mixture was formed into a sheet shape by a doctor blade method to give a green sheet having a thickness of 50 μm.

A conductive paste for an internal electrode was printed on the green sheet. An Ag30%-Pd70% alloy paste was used as the conductive paste. Nine green sheets each provided with the conductive paste were stacked to give a layered product. The layered product was placed in an electric furnace, was held at 1380° C. for 5 hours, and was sintered in the atmosphere over 24 hours in total.

Subsequently, the resulting layered product was cut into a size of 10×2.5 mm. The side faces were ground, and a pair of external electrodes (a first gold electrode and a second gold electrode) for alternately short-circuiting the internal electrodes was formed by DC sputtering to produce a multilayered piezoelectric element as shown in FIG. 3B. In the multilayered piezoelectric element, a titanium adhesive layer having a thickness of 30 nm was formed between each electrode and the layered product.

It was confirmed by observation of the multilayered piezoelectric element that Ag—Pd as the electrode material and the piezoelectric material were alternately formed.

The sample was subjected to polarization treatment for evaluating the piezoelectric constant thereof. Specifically, an electric field of 1 kV/mm was applied to the sample on a hot plate set to a surface temperature of 100° C. for 30 minutes.

The piezoelectric properties of the resulting multilayered piezoelectric element were evaluated. The multilayered piezoelectric element had sufficient insulation properties and satisfactory piezoelectric properties that are equivalent to those of the piezoelectric ceramic in Example 1.

Liquid Discharge Head According to Example 1

A liquid discharge head shown in FIGS. 4A and 4B was produced using the same piezoelectric element as in Example 1. Discharge of an ink according to input electric signals was confirmed.

Liquid Discharge head According to Example 2

A liquid discharge device shown in FIG. 5 was produced using the same piezoelectric element as in Example 2. Discharge of an ink onto a recoding medium according to input electric signals was confirmed.

Ultrasonic Motor According to Example 3

An ultrasonic motor shown in FIG. 7A was produced using the same piezoelectric element as in Example 3. Rotation behavior of the motor according to application of an alternating voltage was confirmed.

Optical Apparatus According to Example 4

An optical apparatus shown in FIGS. 8A and 8B was produced using the same piezoelectric element as in Example 4. Autofocus operation according to application of an alternating voltage was confirmed.

Dust Removing Device According to Example 5

A dust removing device shown in FIGS. 10A and 10B was produced using the same piezoelectric element as in Example 5. A satisfactory dust removing efficiency was confirmed when plastic beads were dispersed and an alternating voltage was applied thereto.

Image Pickup Device According to Example 6

An image pickup device shown in FIG. 13 was produced using the same piezoelectric element as in Example 6. In the operation of the device, dust on the surface of the image pickup unit was satisfactorily removed to provide a dust defect-free image.

Liquid Discharge Head According to Example 7

A liquid discharge head shown in FIGS. 4A and 4B was produced using the same multilayered piezoelectric element as in Example 7. Discharge of an ink according to input electric signals was confirmed.

Liquid Discharge Device According to Example 8

A liquid discharge device shown in FIG. 5 was produced using the same multilayered piezoelectric element as in Example 8. Discharge of an ink onto a recoding medium according to input electric signals was confirmed.

Ultrasonic Motor According to Example 9

An ultrasonic motor shown in FIG. 7B was produced using the same multilayered piezoelectric element as in Example 9. Rotation behavior of the motor according to application of an alternating voltage was confirmed.

Optical Apparatus According to Example 10

An optical apparatus shown in FIGS. 8A and 8B was produced using the same multilayered piezoelectric element as in Example 10. Autofocus operation according to application of an alternating voltage was confirmed.

Dust Removing Device According to Example 11

A dust removing device shown in FIGS. 10A and 10B was produced using the same multilayered piezoelectric element as in Example 11. A satisfactory dust removing efficiency was confirmed when plastic beads were dispersed and an alternating voltage was applied thereto.

Image Pickup Device According to Example 12

An image pickup device shown in FIG. 13 was produced using the same multilayered piezoelectric element as in Example 12. In the operation of the device, dust on the surface of the image pickup unit was satisfactorily removed to provide a dust defect-free image.

Electronic Apparatus According to Example 13

An electronic apparatus shown in FIG. 15 was produced using the sane multilayered piezoelectric element as in Example 13. Loudspeaker operation according to application of an alternating voltage was confirmed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-060237, filed Mar. 16, 2012, which is hereby incorporated by reference herein in its entirety.

INDUSTRIAL APPLICABILITY

The piezoelectric material of the present invention has high piezoelectric constant and mechanical quality factor, causes no load to the environment, and can be used in an apparatus including many piezoelectric materials, for example, a large number of piezoelectric elements, such as an ultrasonic motor, without any problem.

REFERENCE SIGNS LIST 1 first electrode
2 piezoelectric material
3 second electrode
101 piezoelectric element
102 individual liquid chamber
103 diaphragm
104 liquid chamber partition
105 discharge port
106 communication hole
107 common liquid chamber
108 buffer layer
1011 first electrode
1012 piezoelectric material
1013 second electrode
201 oscillator
202 rotor
203 output shaft
2011 elastic ring
2012 piezoelectric element
204 oscillator
205 rotor
206 spring
2041 metal elastic body
2042 multilayered piezoelectric element
310 dust removing device
330 piezoelectric element
320 diaphragm
330 piezoelectric element
331 piezoelectric material
332 first electrode
333 second electrode
336 first electrode face 337 second electrode face
310 dust removing device
320 diaphragm
330 piezoelectric element
51 first electrode
53 second electrode
54 piezoelectric material layer
55 internal electrode
501 first electrode
503 second electrode
504 piezoelectric material layer
505 internal electrode
506a external electrode
506b external electrode
601 camera body
602 mount portion
605 mirror box
606 main mirror
200 shutter unit
300 body chassis
400 image pickup unit
701 front lens group
702 rear lens group (focus lens)
711 quick-detaching mount
712 fixing barrel
713 linear guide barrel
714 front lens group barrel
715 cam ring
716 rear lens group barrel
717 cam roller
718 axial screw
719 roller
720 rotation transmitting ring
722 driven roller
724 manual focus ring
725 ultrasonic motor
726 wave washer
727 ball race
728 focus key
729 connecting member
732 washer
733 low friction sheet
881 liquid discharge device
882 exterior
883 exterior
884 exterior
885 exterior
887 exterior
890 recovering portion
891 recording portion
892 carriage
896 device main body
897 automatic feeder
898 ejection port
899 conveying portion
901 optical device
908 release button
909 stroboscope light emitting unit
912 loudspeaker
914 microphone
916 assist light unit
931 body
932 zoom lever
933 power button

The invention claimed is:

1. A piezoelectric material comprising:
a perovskite-type metal oxide represented by Formula (1):

$$(Ba_{1-x}Ca_x)_a(Ti_{1-y}Zr_y)O_3 \ (1.00 \leq a \leq 1.01, \ 0.125 \leq x < 0.155, \text{ and } 0.041 \leq y \leq 0.074)$$

as a main component; and
Mn component,
wherein the piezoelectric material:
   contains Mn in a content of 0.12 parts by weight or more and 0.40 parts by weight or less based on 100 parts by weight of the metal oxide on a metal basis; and
   is polarized,
wherein an average equivalent circular diameter of crystal grains of the piezoelectric material is 1 μm or more and 10 μm or less.

2. The piezoelectric material according to claim 1, wherein the piezoelectric material has a Curie temperature of 100° C. or more.

3. The piezoelectric material according to claim 1, wherein the value of y in Formula (1) is in the range of $0.051 \leq y \leq 0.074$.

4. The piezoelectric material according to claim 1, having a relative density of 97.0% or more and 100% or less.

5. A piezoelectric element comprising a first electrode, a piezoelectric material, and a second electrode, wherein the piezoelectric material is a piezoelectric material according to claim 1.

6. A multilayered piezoelectric element comprising piezoelectric material layers and electrodes including an internal electrode alternately stacked, wherein the piezoelectric material layers are constituted of a piezoelectric material according to claim 1.

7. The multilayered piezoelectric element according to claim 6, wherein the internal electrode contains Ag and Pd; and the weight ratio M1/M2 of the content M1 of the Ag to the content M2 of the Pd satisfies a relationship of $0.25 \leq M1/M2 \leq 4.0$.

8. The multilayered piezoelectric element according to claim 6, wherein the internal electrode contains at least one of Ni and Cu.

9. A liquid discharge head comprising a liquid chamber including a vibrating unit having a piezoelectric element according to claim 5 and a discharge port communicating with the liquid chamber.

10. A liquid discharge device comprising a recording medium conveying portion and a liquid discharge head according to claim 9.

11. An ultrasonic motor comprising a vibrating member including a piezoelectric element according to claim 5, and a rotor being in contact with the vibrating member.

12. An optical apparatus comprising a driving unit including an ultrasonic motor according to claim 11.

13. A vibratory device comprising a vibrating member including a piezoelectric element according to claim 5.

14. A dust removing device comprising a vibrating member including a piezoelectric element according to claim 5.

15. An image pickup device comprising at least a dust removing device according to claim 14 and an image pickup element unit, wherein the dust removing device includes a vibrating member disposed on the light-receiving surface side of the image pickup element unit.

16. An electronic apparatus comprising a piezoelectric acoustic component including a piezoelectric element according to claim 5.

17. A liquid discharge head comprising a liquid chamber including a vibrating unit having a multilayered piezoelectric element according to claim 6 and a discharge port communicating with the liquid chamber.

18. A liquid discharge device comprising a recording medium conveying portion and a liquid discharge head according to claim 17.

19. An ultrasonic motor comprising a vibrating member including a multilayered piezoelectric element according to claim 6, and a rotor being in contact with the vibrating member.

20. An optical apparatus comprising a driving unit including an ultrasonic motor according to claim 19.

21. A vibratory device comprising a vibrating member including a multilayered piezoelectric element according to claim 6.

22. A dust removing device comprising a vibrating member including a multilayered piezoelectric element according to claim 6.

23. An image pickup device comprising at least a dust removing device according to claim 22 and an image pickup element unit, wherein the dust removing device includes a vibrating member disposed on the light-receiving surface side of the image pickup element unit.

24. An electronic apparatus comprising a piezoelectric acoustic component including a multilayered piezoelectric element according to claim 6.

25. A piezoelectric material comprising:
an oxide including Ba, Ca, Ti, and Zr; and
Mn, wherein
an x that represents a molar ratio of Ca to a sum of Ba and Ca satisfies $0.125 \leq x \leq 0.155$,
a y that represents a molar ratio of Zr to a sum of Ti and Zr satisfies $0.041 \leq y \leq 0.074$,
an a that represents a molar ratio of the sum of Ba and Ca to the sum of Ti and Zr satisfies $1.00 \leq a \leq 1.01$,
a content of Mn is 0.12 parts by weight or more and 0.40 parts by weight or less based on 100 parts by weight of the oxide on a metal basis, the piezoelectric material is polarized, and
an average equivalent circular diameter of crystal grains of the piezoelectric material is 1 μm or more and 10 μm or less.

26. The piezoelectric material according to claim 25, wherein the oxide is a perovskite-type metal oxide.

27. The piezoelectric material according to claim 25, wherein the oxide is represented by $(Ba_{1-x}Ca_x)_a(Ti_{1-y}Zr_y)O_3$.

* * * * *